(12) United States Patent
Santos Rodriguez et al.

(10) Patent No.: US 11,515,264 B2
(45) Date of Patent: Nov. 29, 2022

(54) METHOD FOR PROCESSING A SEMICONDUCTOR WAFER, SEMICONDUCTOR COMPOSITE STRUCTURE AND SUPPORT STRUCTURE FOR SEMICONDUCTOR WAFER

(71) Applicant: Infineon Technologies AG, Neubiberg (DE)

(72) Inventors: Francisco Javier Santos Rodriguez, Villach (AT); Alexander Breymesser, Villach (AT); Erich Griebl, Dorfen (DE); Michael Knabl, Finkenstein (AT); Matthias Kuenle, Villach (AT); Andreas Moser, Maria-Rain (AT); Roland Rupp, Lauf (DE); Hans-Joachim Schulze, Taufkirchen (DE); Sokratis Sgouridis, Annenheim (AT); Stephan Voss, Munich (DE)

(73) Assignee: Infineon Technologies AG, Neubiberg (DE)

( * ) Notice: Subject to any disclaimer, the term of this patent is extended or adjusted under 35 U.S.C. 154(b) by 524 days.

(21) Appl. No.: 16/421,707

(22) Filed: May 24, 2019

(65) Prior Publication Data
US 2019/0363057 A1 Nov. 28, 2019

(30) Foreign Application Priority Data
May 25, 2018 (DE) .......................... 102018112603.4

(51) Int. Cl.
*H01L 23/00* (2006.01)
*H01L 23/16* (2006.01)

(52) U.S. Cl.
CPC ............ *H01L 23/562* (2013.01); *H01L 23/16* (2013.01)

(58) Field of Classification Search
CPC ............. H01L 21/2007; H01L 21/7806; H01L 21/6835; H01L 21/187
See application file for complete search history.

(56) References Cited

U.S. PATENT DOCUMENTS

2014/0130969 A1* 5/2014 McCutcheon .......... B32B 38/10
156/247

FOREIGN PATENT DOCUMENTS

| DE | 212005000047 U1 | 9/2007 |
| DE | 102015216619 A1 | 3/2017 |
| JP | 2017055022 A | 3/2017 |

* cited by examiner

*Primary Examiner* — Selim U Ahmed
(74) *Attorney, Agent, or Firm* — Murphy, Bilak & Homiller, PLLC

(57) ABSTRACT

A method for processing a semiconductor wafer is proposed. The method may include reducing a thickness of the semiconductor wafer. A carrier structure is placed on a first side of the semiconductor wafer, e.g. before or after reducing the thickness of the semiconductor wafer. The method further includes providing a support structure on a second side of the semiconductor wafer opposite to the first side, e.g. after reducing the thickness of the semiconductor wafer. Methods for welding a support structure onto a semiconductor wafer are proposed. Further, semiconductor composite structures with support structures welded onto a semiconductor wafer are proposed.

15 Claims, 11 Drawing Sheets

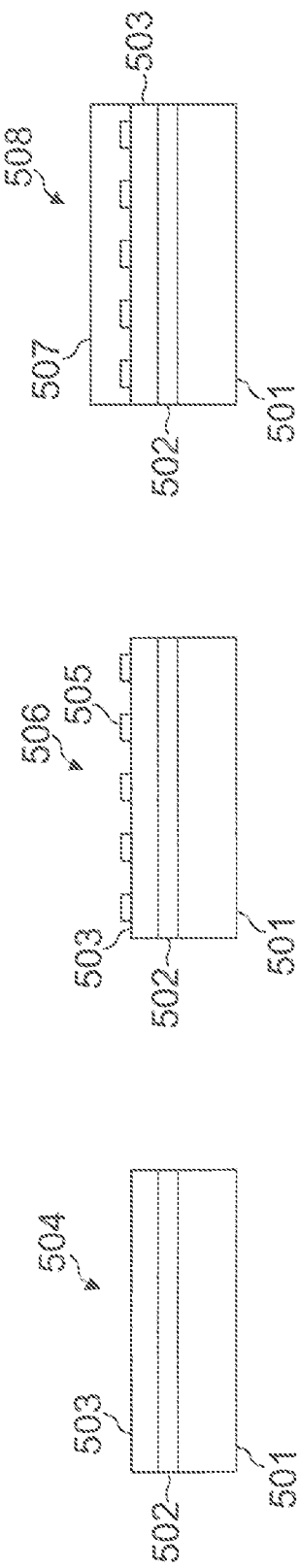
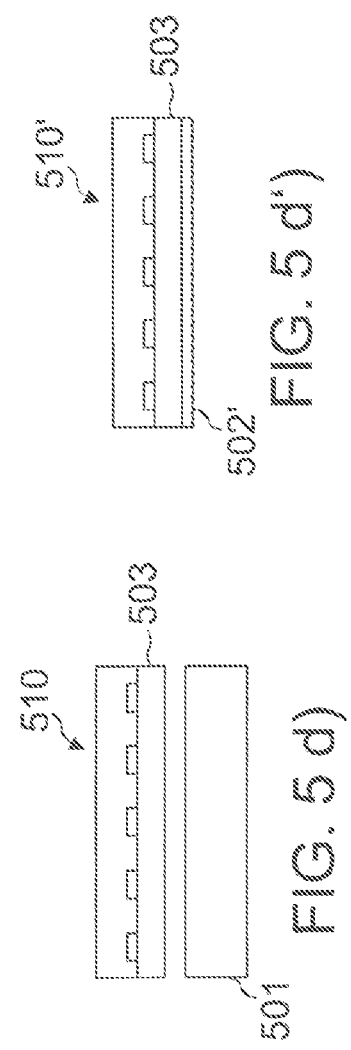
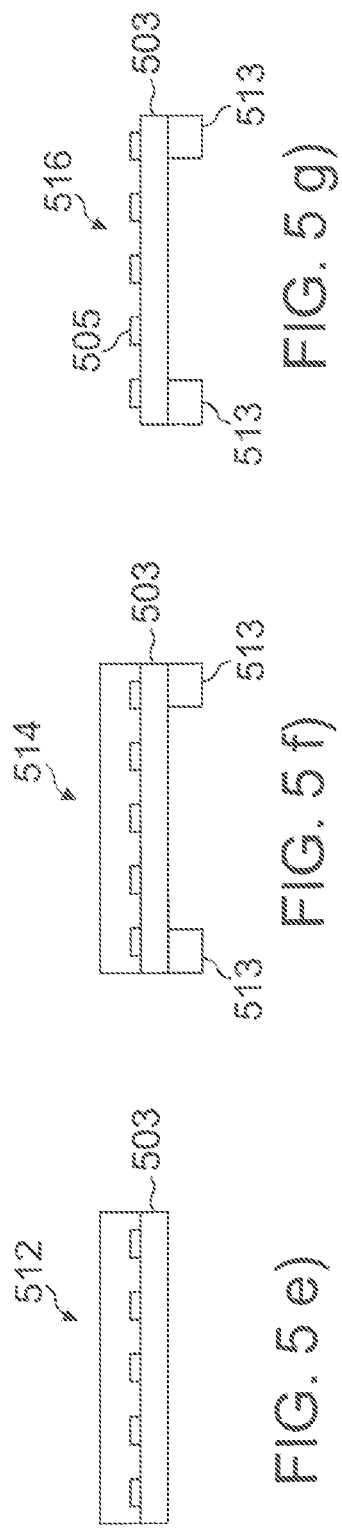

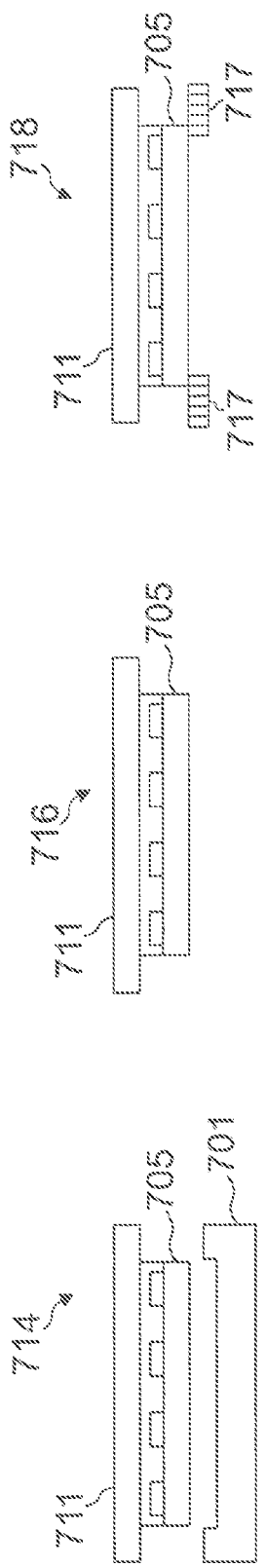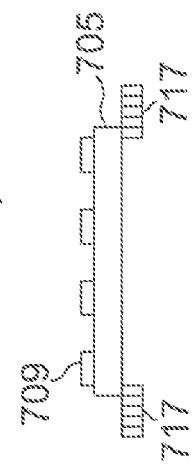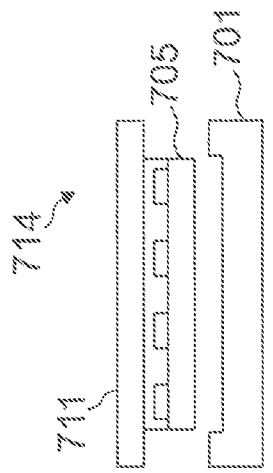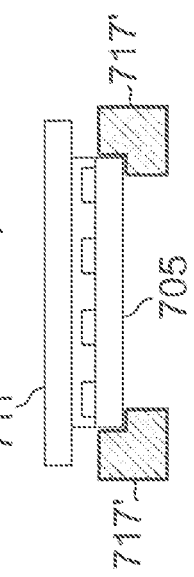
FIG. 7 g) FIG. 7 h) FIG. 7 i) FIG. 7 i') FIG. 7 j)

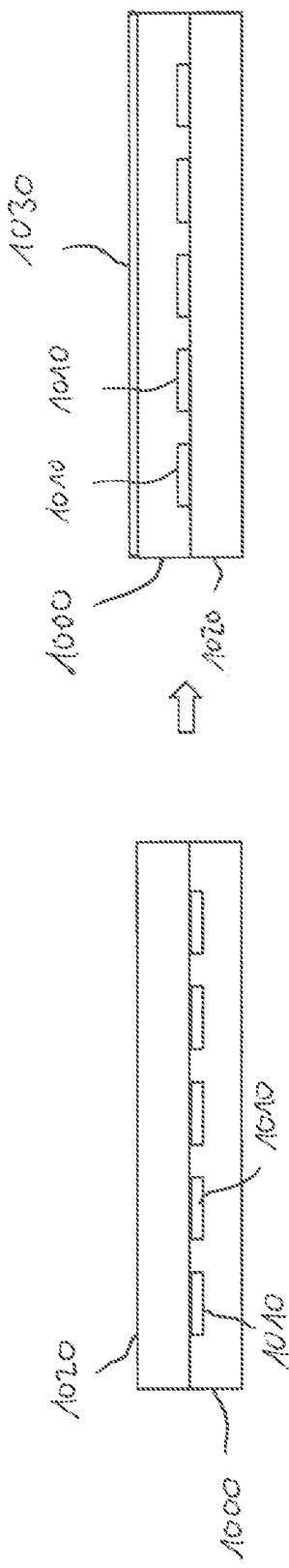
Fig. 10a
Fig. 10b
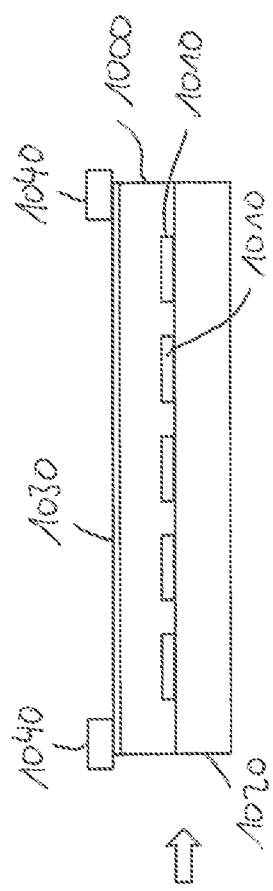
Fig. 10c
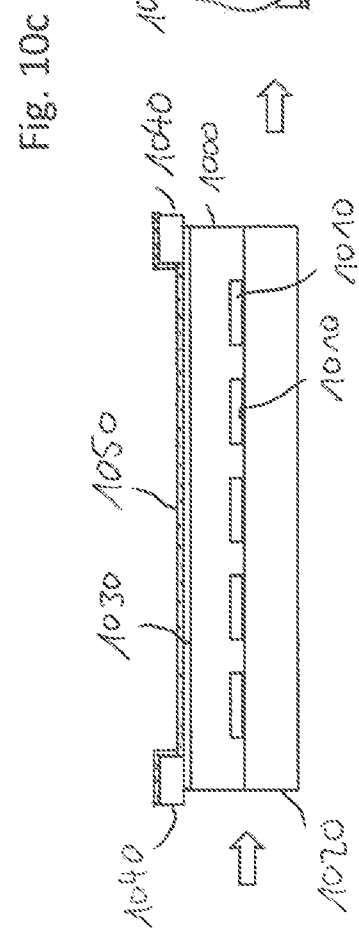
Fig. 10d
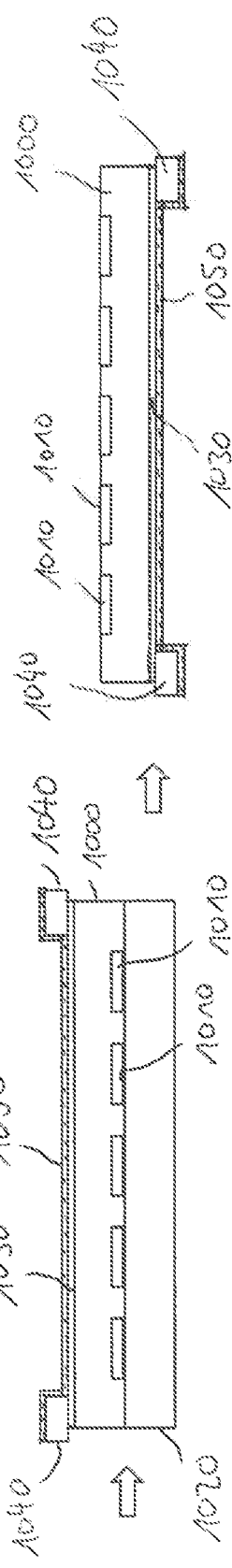
Fig. 10e

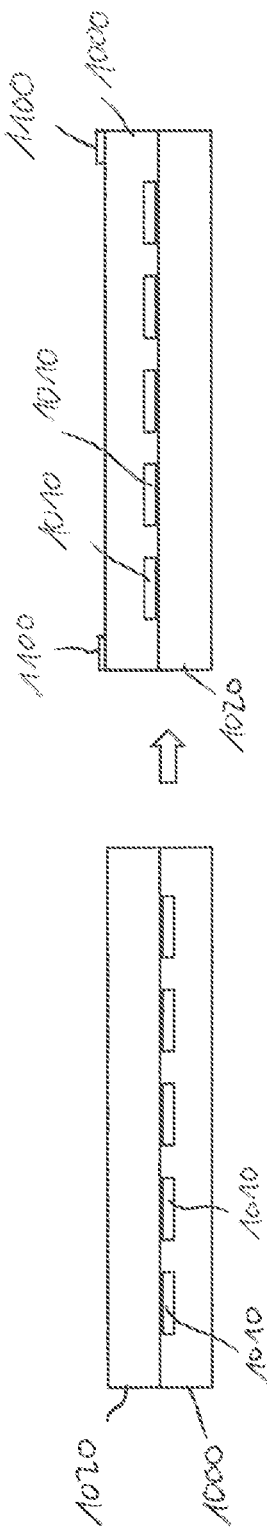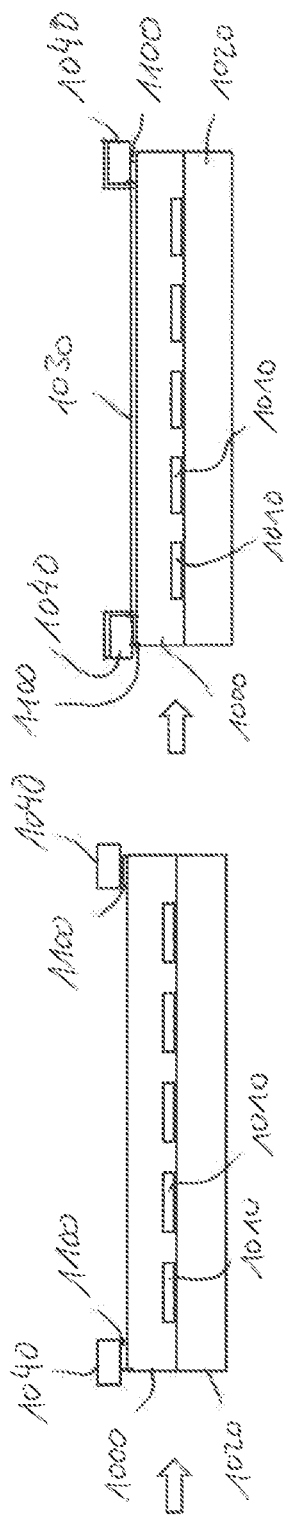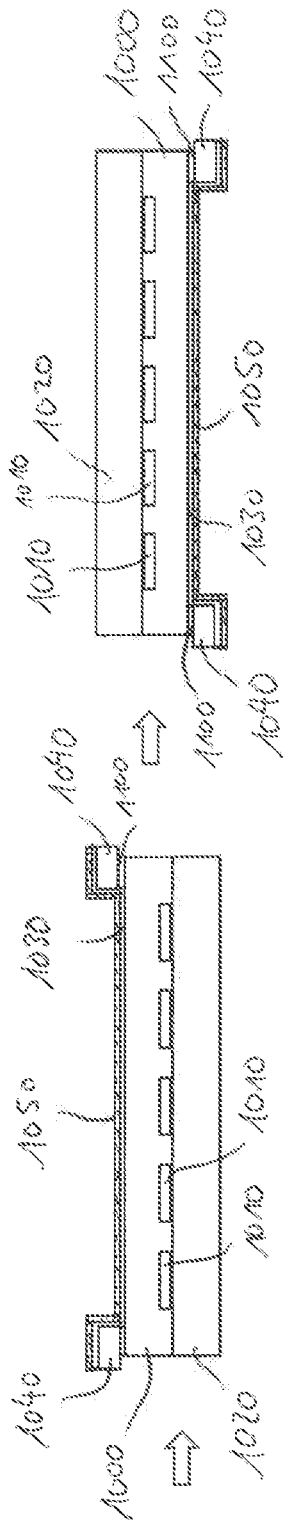

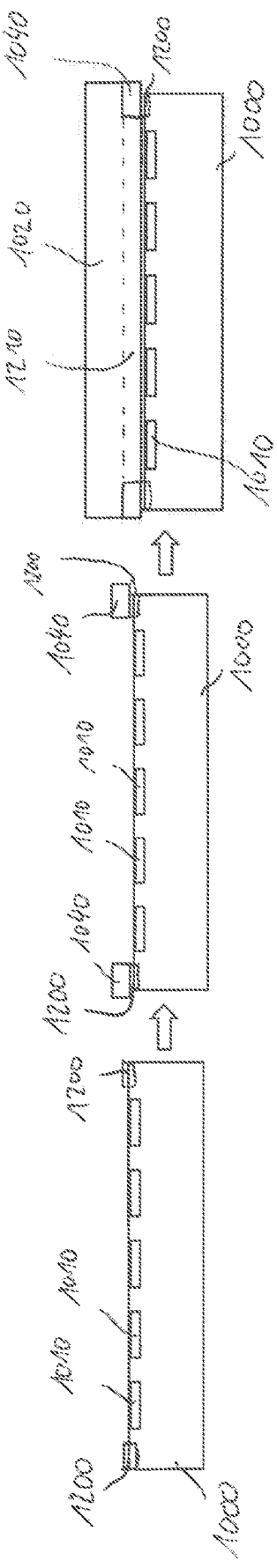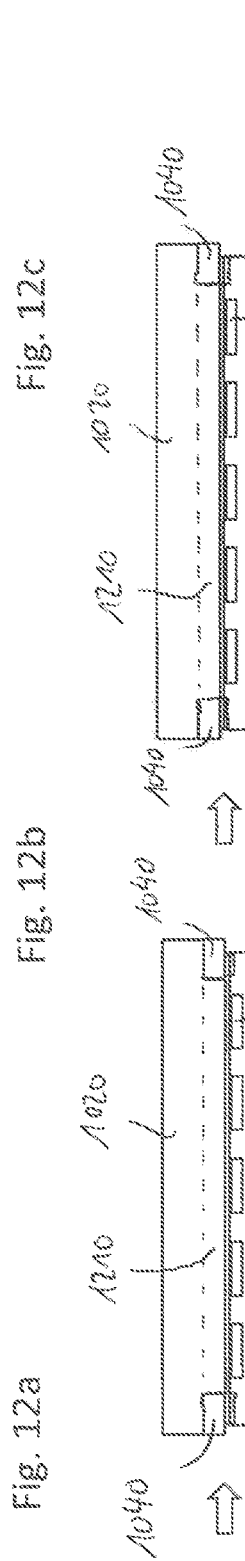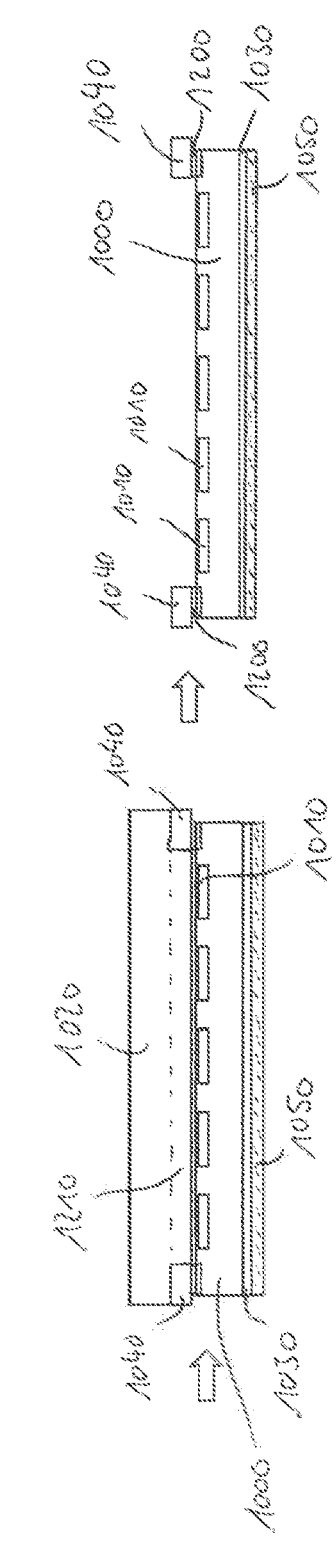

METHOD FOR PROCESSING A SEMICONDUCTOR WAFER, SEMICONDUCTOR COMPOSITE STRUCTURE AND SUPPORT STRUCTURE FOR SEMICONDUCTOR WAFER

TECHNICAL FIELD

Examples relate to methods for processing a semiconductor wafer. Further examples relate to semiconductor composite structures and to support structures for semiconductor wafers.

BACKGROUND

Thin semiconductor wafers may be mechanically fragile due to its low thickness and there may be a risk to damage or brake the semiconductor wafer during processing or measuring the semiconductor wafer.

There may be a demand to provide improved concepts for providing mechanical stability for thin semiconductor wafers.

SUMMARY

An example relates to a method for processing a semiconductor wafer. The method may comprise welding at least one support structure onto a semiconductor wafer. The method may further comprise reducing a thickness of the semiconductor wafer. The thickness may be reduced before or after welding the at least one support structure.

An example relates to a method for processing a semiconductor wafer. According to an embodiment, the method comprises reducing a thickness of the semiconductor wafer. The method comprises placing a carrier structure on a first side of the semiconductor wafer. Placing the carrier structure may take place before or after reducing the thickness of the semiconductor wafer. The method comprises providing a support structure on a second side of the semiconductor wafer opposite to the first side, after reducing the thickness of the semiconductor wafer.

According to an embodiment, a method for processing a semiconductor wafer comprises attaching a carrier structure to a front side of the semiconductor wafer. The method may comprise providing a support structure on a back side of the semiconductor wafer.

An example relates to a semiconductor composite structure. The semiconductor composite structure may comprise an electrical element structure of a semiconductor device. The semiconductor device may be formed at a front side of a semiconductor wafer of the semiconductor composite structure. The semiconductor composite structure may further comprise at least one support structure. The at least one support structure may be welded onto the semiconductor wafer.

An example relates to a semiconductor composite structure. According to an embodiment, the semiconductor composite structure comprises an electrical element structure of a semiconductor device formed at a front side of a semiconductor wafer of the semiconductor composite structure. The semiconductor wafer may further comprise a support structure located at a back side of the semiconductor wafer. In an embodiment, a material of the support structure may differ from a material of the semiconductor wafer. In an embodiment, a connecting layer is located between the semiconductor wafer and the support structure.

An example relates to a support structure for a semiconductor wafer. A maximum height of a cross section of the support structure may be at least 0.1 mm and at most 3 mm. A cross sectional area of the support structure may be step-shaped. An outer diameter of the support structure may differ from a diameter of a semiconductor wafer by at most 0.5% of the diameter of a semiconductor wafer.

Those skilled in the art will recognize additional features and advantages upon reading the following detailed description, and upon viewing the accompanying drawings.

BRIEF DESCRIPTION OF THE FIGURES

Some examples of apparatuses and/or methods will be described in the following by way of example only, and with reference to the accompanying figures, in which:

FIG. 5a, 5b, 5c, 5d, 5d', 5e, 5f, and 5g show an embodiment of a method for processing a semiconductor wafer comprising reducing a thickness of the semiconductor wafer by separating two parts of the semiconductor wafer;

FIG. 10a-10e show an embodiment of a method for processing a semiconductor wafer comprising welding a support ring onto the semiconductor wafer;

FIG. 11a-11f show an embodiment of a method for processing a semiconductor wafer comprising welding a support ring onto the semiconductor wafer by using an absorption layer of silicon; and FIG. 12a-12g show an embodiment of a method for processing a semiconductor wafer comprising welding a support ring onto a front side of the semiconductor wafer.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. Furthermore, the terms "on" or "onto" are not to be construed as meaning only "directly on". Rather, if one element is positioned "on" another element or connected "onto" another element (e.g., a layer is "on" another layer or is connected "onto" another element), a further component (e.g., a further layer) may be positioned between the two elements. If two elements A and B are combined using an "or", this is to be understood to disclose all possible combinations, i.e. only A, only B as well as A and B. An alternative wording for the same combinations is "at least one of A and B". The same applies for combinations of more than two elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
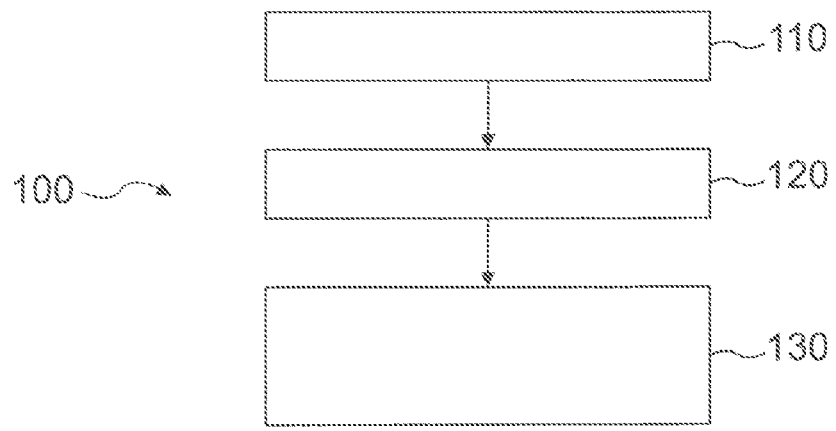
FIG. 1 shows a flow chart of an embodiment of a method for processing a semiconductor wafer.

FIG. 1 shows a flow chart of an embodiment of a method 100 for processing a semiconductor wafer. The method 100 may comprise placing 120 a carrier structure on a first side of the semiconductor wafer. Additionally, the method 100 may comprise providing 130 a support structure at a second side of the semiconductor wafer opposite to the first side, after reducing the thickness of the semiconductor wafer. Providing the support structure may comprise attaching and/or depositing the support structure. For example, the support structure may be attached to the semiconductor wafer or deposited on the semiconductor wafer or a first part of the support structure may be attached to the semiconductor wafer and a second part of the support structure may be deposited on the semiconductor wafer or the first part of the support structure.

The method 100 comprises the optional step of reducing 110 a thickness of the semiconductor wafer. In this case, the thickness of the semiconductor wafer, the carrier structure may be placed 120 on a first side of the semiconductor wafer before or after reducing 110 the thickness of the semiconductor wafer.

A semiconductor wafer may be mechanically fragile and testing or further processing the semiconductor wafer in some cases may be difficult due to a risk of damaging the fragile semiconductor wafer. For example, a semiconductor wafer with low mechanical stability might break during testing or electrically measuring the semiconductor wafer. By providing 130 the support structure to the semiconductor wafer the mechanical stability may be increased.

For example, the support structure may be positioned within an edge region of the semiconductor wafer or circumferentially around a center region of the semiconductor wafer. The support structure may increase an effective thickness of the semiconductor wafer within the edge region and increase the mechanical stability of the semiconductor wafer due to mechanical supporting the semiconductor wafer. Providing 130 the support structure may enable measuring or testing semiconductor devices on wafer level with a reduced risk of damaging the semiconductor wafer. In this way, the yield may be improved and/or the manufacturing costs may be reduced. Further, the method 100 may be used for processing a thin semiconductor wafer (e.g. with a thickness smaller than 300 µm), while providing an increased mechanical stability for the semiconductor wafer due to providing the support structure by providing 130 the support structure.

The support structure may be a ring-shaped structure, e.g. a support ring structure. The support structure may comprise a geometry similar or equal to the geometry of the semiconductor wafer. As an example, the semiconductor wafer may have a circular geometry and the support structure may accordingly have a circular geometry in a top view. Alternatively, the support structure may have a polygonal geometry in a top view, e.g. the support structure may have a square shape or a rectangular shape. A polygonal support structure may be provided for corresponding polygonal semiconductor wafers.

Providing 130 the support structure at a side, for example the second side or the back side, of the semiconductor wafer may comprise attaching at least part of the already pre-formed, wherein pre-formed may e.g. comprise prefabricated, support structure, for example the entire support structure, to said side of the semiconductor wafer, particularly in one piece. Attaching may be performed by means of bonding and/or gluing. Prefabricating a part of the support structure may include e.g. hot embossing, mechanical forming, and/or chemical etching.

In addition or as an alternative, providing 130 the support structure at said side of the semiconductor wafer may comprise depositing at least a part of the material of the support structure, for example the entire support structure, on the semiconductor wafer. Depositing may, for example, include at least one of 3D printing or chemical vapor deposition.

For example, the support structure can be formed at the semiconductor wafer for mechanically supporting the semiconductor wafer before measuring or testing semiconductor devices formed on the semiconductor wafer.

In one embodiment, the support structure may be removable from the semiconductor wafer and reusable for further semiconductor wafers. In this embodiment, the support structure may be a prefabricated support structure, for example an entirely prefabricated support structure. After measuring or testing, the support structure may be removed from the semiconductor wafer. Reusing the support structure may reduce the costs for mechanically supporting a plurality of semiconductor wafers. The support structure may be removed after attaching the semiconductor wafer with the support structure to a sawing tape. In this case, a cutting process or a sawing process, for example a mechanical cutting process and/or a laser-induced cutting process, can be used to separate the support structure from the wafer.

By providing 130 the support structure, wafer level tests at target thickness of the semiconductor wafer may be enabled after reducing 110 a thickness of the semiconductor wafer.

After providing 130 the support structure at the semiconductor wafer, the support structure and the semiconductor wafer are connected such that the support structure can be removed from the semiconductor wafer without destroying the semiconductor wafer and/or the support structure. This may also be referred to as a "non-destructively detachable connection" between the support structure and the semiconductor wafer. That is to say, the support structure may be removed from the semiconductor wafer by, for example, dissolving a bonding material between the semiconductor wafer and the support structure (e.g., by using chemical solvents and/or a heat treatment), without destroying the support structure.

Placing 120 the carrier structure at the semiconductor wafer may include placing the carrier structure on the semiconductor wafer or placing the semiconductor wafer on the carrier structure. The carrier structure 120 may be placed at a front side or at a back side of the semiconductor wafer before reducing the thickness of the semiconductor wafer. For example, the carrier structure may be a carrier wafer, a dummy wafer or a chuck of an apparatus used for reducing the thickness. For example, the carrier structure may be attached (e.g. bonded or glued) to the semiconductor wafer or may be placed on the carrier structure (e.g. placed on a chuck using vacuum to hold the semiconductor wafer in place).

For example, the carrier structure may mechanically hold and/or stabilize the semiconductor wafer during reducing 110 the thickness and hold the thinned semiconductor wafer on a first side of the semiconductor wafer after reducing 110 the thickness. Alternatively, the carrier structure may be placed 120 on the semiconductor wafer after reducing the thickness of the semiconductor wafer. For example, the semiconductor wafer may be placed on a chuck of an apparatus used for forming the support structure. The chuck may work as a carrier structure during forming the support structure.

The support structure may be formed 130 at a second side of the semiconductor wafer after reducing 110 the thickness. For example, the second side is located opposite to the first side. The support structure may be provided 130 while the carrier structure holds the semiconductor wafer. The second side may be a front side or a back side of the semiconductor wafer. The front side of the semiconductor wafer may be the side used to implement more sophisticated and complex structures (e.g. trenches, source/drain doping regions and/or gates of transistors and/or wiring layers of a wiring layer stack) than at the back side of the semiconductor wafer, since the process parameters (e.g. temperature) and the handling may be limited for the back side, if structures are already formed at one side of the semiconductor substrate, for example.

The support structure may be provided at the front side of the semiconductor wafer, while the semiconductor is located on the carrier structure. The support structure may comprise an opening in a center region so that measurements of electrical element structures (e.g. test structures or device structures) at the front side of the semiconductor device may be enabled while the support structure is positioned, e.g. formed, at the front side.

Alternatively, the support structure may be provided 130 at the back side of the semiconductor wafer. For example, the back side of the semiconductor wafer may be unstructured and/or flat. For example, the semiconductor material of the semiconductor wafer may form the back side of the semiconductor wafer or a back side metal layer (e.g. back side metallization) may be formed or located at the back side of the semiconductor wafer at the time, the support structure is formed, i.e. attached and/or deposited, at the back side. Providing 130 the support structure on the back side of the semiconductor wafer may enable an improved accessibility of front side structures for electrical measurements at wafer level. Further, a width of a contact region between the semiconductor wafer and the support structure may be increased and may be at least 0.5% (or at least 2%, at least 5%; or at least 10%) of a diameter of the semiconductor wafer. A wider contact region may increase a mechanical stability of the semiconductor wafer.

Providing 130 the support structure on the back side may facilitate processing, testing and/or measuring test structures and/or devices at the front side of the semiconductor wafer. For example, by providing the support structure transportation of the semiconductor wafer may be facilitated.

For example, the support structure may be provided by attaching 130 the support structure to the second side of the semiconductor wafer by one of gluing, bonding, adhesive bonding, laser melting, laser bonding and soldering. Attaching 130 the support structure may comprise attaching a prefabricated support structure that may be glued to the semiconductor wafer by using at least one of thermal glue, hotmelt adhesive, metal glue, metal adhesive (e.g. if the support structure comprises a metal), glass solder (e.g. if the support structure comprises glass), adhesive tape, and two-component adhesive. The glue may be provided to the support structure and/or to an edge region of the semiconductor wafer before attaching the support structure to the semiconductor wafer. The glue may be provided exclusively within a contact region of the support structure and/or the semiconductor wafer that provides contact between the semiconductor wafer and the support structure when the support structure is attached to the semiconductor wafer.

For example, solder or thermal glue may be provided between the semiconductor wafer and the support structure, and the support structure may be attached to the semiconductor wafer by first heating the solder or thermal glue and afterwards cooling it. For example, UV (UV: ultraviolet) adhesive, hardening when exposed to UV irradiation, may be used to attach 130 the support structure. Attaching 130 a support structure to the semiconductor wafer may be time efficient as a prefabricated support structure may be used.

Attaching 130 the support structure by gluing or soldering the support structure to the semiconductor wafer may facilitate reusing the support structure. For example, an attached support structure may be removable from the semiconductor wafer by heating a thermal glue or solder used for attaching the support structure. By heating, the thermal glue or solder may soften so that the support structure can be removed from the semiconductor wafer without exerting a mechanical force to the semiconductor wafer and with reduced risk to damage the semiconductor wafer during removing the support structure. Enabling reusing the support structure may reduce costs as prefabricated support structures may be used multiple times and it might not be necessary to fabricate respective individual support structures for a plurality of semiconductor wafers.

Alternatively, the support structure may be provided by depositing material on the semiconductor wafer to form the support structure. The support structure may be formed directly at an edge region of the second side of the semiconductor wafer. Depositing may comprise using a 3D-printing process. In the 3D-printing process material may be added or joined to the semiconductor wafer, e.g. in additive layers, to build the support structure on the semiconductor wafer. For example, a computer-controlled 3D-printer may be configured to deposit material in an edge region of the semiconductor wafer to form a ring. It may be possible to mask a center region of the semiconductor wafer and to deposit material only in an edge region of the semiconductor wafer. The 3D-printing process may comprise providing a liquid photopolymer resin at the second side of the semiconductor wafer and solidify the resin within the edge region by irradiating the liquid photopolymer resin in the edge region e.g. with UV-light or a laser beam. The 3D-printing process may comprise providing a thermoplastic or thermoplastic resin. The solidified resin may form the support structure. Alternatively, other liquid materials solidifying at irradiation may be used for the 3D-printing process.

Depositing 130 the support structure may enable providing an individual support structure fitted to a semiconductor wafer. A size of the support structure may be individually adapted to the semiconductor wafer by depositing the support structure. Depositing material for forming the support structure may facilitate providing a support structure surrounding or covering the semiconductor wafer at circumference of the semiconductor wafer, e.g. a step-shaped support structure may be provided.

For example, the support structure may comprise or consist of at least one of glass, sapphire, silicon, ceramic, carbon, plastic, polysilicon carbide, polysilicon and metal. A prefabricated support structure attachable to a semiconductor wafer may be fabricated by using one of said materials. For example, at least one of glass, sapphire, silicon, ceramic, carbon, plastic, and metal may be deposited at the semiconductor wafer to form the support structure. A material of the support structure may be the same material as a substrate material of the semiconductor wafer. A crystallization structure of a material of the support structure may differ from a crystallization structure of a material of the semiconductor wafer.

In one example, a crystal orientation of the semiconductor material of the semiconductor wafer differs from a crystal orientation of a semiconductor material of the support structure. In this example, both the semiconductor material of the semiconductor wafer and the semiconductor material of the support structure may have the same crystal structure and the same crystallinity (for example, monocrystalline 4H-SiC), but outer areas of the semiconductor material of the semiconductor wafer and the semiconductor material of the support structure do not coincide with the same crystal directions. Hereinafter, the crystal structure of a semiconductor material refers to its polytype (in particular, its polymorphs), wherein the crystallinity refers to the crystal type or quality (e.g., polycrystalline and monocrystalline).

In another example, a crystal structure of the semiconductor material of the semiconductor wafer differs from a crystal structure of a semiconductor material of the support structure. That is to say, the polytype of the semiconductor material of the semiconductor wafer may differ from the polytype of the semiconductor material of the support structure. For example, the semiconductor material of the semiconductor wafer is 4H-SiC, whereas the semiconductor material of the support structure is 3C-SiC or 6H-SiC.

In yet another example, a crystallinity of the semiconductor material of the semiconductor wafer differs from a crystallinity of a semiconductor material of the support structure. For example, the semiconductor material of the semiconductor wafer is monocrystalline, whereas the semiconductor material of the support structure is polycrystalline (e.g. poly-SiC or poly-Si).

For example, a crystallinity, a crystal structure and/or a crystal orientation of a semiconductor material of the semiconductor wafer may differ from a crystallinity, a crystal structure and/or a crystal orientation of a semiconductor material of the support structure.

Optionally, a cross-sectional area of the support structure may comprise a step or may be step-shaped or L-shaped. In particular, the support structure may comprise an inner step and an outer step. The outer step may be an outer part of the support structure that frames, e.g. surrounds or radially frames, the inner step. The inner step may have a smaller vertical height than the outer step. The inner step and the outer step may share a common, in particular plane, surface.

For example, the second side of the semiconductor wafer may be positioned on the inner step of the support structure when attaching the support structure to the semiconductor wafer. In other words, attaching 130 the support structure to the semiconductor wafer may comprise positioning the semiconductor wafer on the inner step. Accordingly, the semiconductor wafer may be located on the inner step of the support structure, e.g. an inner part of the support structure, and be surrounded by an outer part of the support structure. For example, a surface of the front side of the semiconductor wafer and a surface of the formed support structure may lie in a same plane. The surface of the support structure may be a top side of the support structure, for example a top surface of the outer step. A height difference between the step of the support structure to the top side of the support structure may differ from the thickness of the semiconductor wafer by at most 10% (or at most 5% or at most 1%) of the thickness of the semiconductor wafer.

Optionally, an outer diameter of the support structure may differ from a diameter of a semiconductor wafer by at most 5% (or at most 3%, at most 1%, at most 0.5% or at most 0.25%) of the diameter (e.g. a standard diameter) of a semiconductor wafer. The outer diameter of the support structure may be an average outer diameter of the support structure. For example, a maximum outer diameter of the support structure may differ from the average diameter of the support structure by at most 2% (or at most 1% or at most 0.1%) of the average diameter of the support structure. For example, a diameter of a semiconductor wafer may be 150 mm (or 200 mm, 300 mm, or 450 mm). For example, a support structure with said outer diameter may enable to process or measure a semiconductor wafer with an outer diameter differing from a standard diameter, e.g. by more than 1% of the standard diameter, with standard semiconductor processing or measuring equipment suitable for standard semiconductor wafers.

Optionally, a maximum height of the support structure in cross section may be at most 5 mm (or at most 3 mm, at most 1 mm, at most 0.5 mm or at most 0.1 mm) and/or at least 0.05 mm (or at least 0.1 mm, at least 1 mm or at least 2 mm). The height may be measured in an axial direction of the support structure.

In one exemplary embodiment, a height of a radially outer portion (e.g. the outer step) of the support structure may be larger than a height of a radially inner portion (e.g. the inner step) of the support structure. The height at the radially outer portion may be more than 275 µm larger (or more than 375 µm larger, more than 525 µm, more than 675 µm, more than 925 µm larger or more than 1.0 mm larger) than the height of the radially inner portion. The height of the interior portion might be at least 0.05 mm (or at least 0.1 mm or at least 0.5 mm).

Optionally, a maximum width of a cross section of the support structure may be at most 50 mm (or at most 20 mm, at most 10 mm, at most 4 mm or at most 2 mm) and/or at least 3 mm (or at least 5 mm or at least 10 mm). For example, the width of the cross section is a difference between the outer diameter of the support structure and an inner diameter of the support structure. For example, the maximum width may be at least 1% (or at least 5%, at least 10% or at least 20%) of the outer diameter of the support structure and/or at most 20% (or at most 10% or at most 5%) of the outer diameter of the support structure.

For example, reducing 110 the thickness of the semiconductor wafer comprises reducing the thickness from a first thickness of the semiconductor wafer to a second thickness of the semiconductor wafer, which second thickness is smaller than the first thickness. The first thickness may be smaller than 10 mm (or smaller than 5 mm or smaller than 1 mm) and/or larger than 400 µm (or larger than 500 µm or larger than 700 µm). The second thickness may then be smaller than 300 µm.

A semiconductor wafer to be formed may be a thin semiconductor wafer. For example, after reducing the thickness of the semiconductor wafer, a thickness of the semiconductor wafer may be at most 300 µm (or at most 200 µm, at most 100 µm, at most 70 µm, at most 50 µm) and/or at least 5 µm (or at least 10 µm, at least 50 µm, at least 70 µm or at least 100 µm).

For example, reducing 110 the thickness of the semiconductor wafer may comprise thinning the semiconductor wafer by at least one of physical removal, mechanical removal, chemical removal, and plasma removal, for example performed by at least one of grinding, laser ablation, plasma etching, and etching the semiconductor wafer. For example, the complete second side of the semiconductor wafer may be grinded and/or etched (e.g. by chemical mechanical polishing) before providing 130 the support structure.

Alternatively or additionally, reducing 110 the thickness of the semiconductor wafer may comprise splitting the semiconductor wafer along a splitting region. By splitting the semiconductor wafer, the semiconductor wafer may be separated into two parts. A diameter of the semiconductor wafer may be the same before splitting and after splitting. Splitting may comprise at least one of cutting along the splitting region, etching the splitting region, and separating the semiconductor wafer along the splitting region. The splitting region may comprise at least one of silicon germanium, silicon oxide, silicon nitride, and a region of porous semiconductor material. The porous semiconductor material may comprise small cavities formed by electrochemical anodization and/or voids formed by incomplete filling of trenches. The voids may be elongated cavities within the semiconductor material, for example drop-shaped cavities.

For example, the semiconductor wafer may be split along a voids-containing-layer as a splitting region. Alternatively, the semiconductor wafer may be split along a splitting region that can be removed with a high selectivity (e.g. SiO2 and/or SiGe).

For example, the splitting region may extend laterally over the semiconductor wafer. The splitting region may comprise or be a lateral separation or a splitting layer. The splitting region may extend over at least 60% (or over at least 90%, over at least 95% or over at least 99%) and/or over at most 90% (or at most 80% or at most 70%) of a lateral area of the semiconductor wafer. The splitting region may be provided in a center region of the semiconductor wafer.

In at least one embodiment, the splitting region may be a buried splitting layer. The buried splitting layer may have been formed in the semiconductor wafer before reducing the thickness of the semiconductor wafer. For example, the splitting region embodied as a buried splitting layer may be formed at the first side of the semiconductor wafer. The buried splitting layer may be formed before an epitaxial semiconductor layer is formed (e.g., via deposition, epitaxial growth and/or etching) over the splitting region and/or the first side of the semiconductor wafer. The splitting region may be buried between the semiconductor wafer and the epitaxial semiconductor layer and/or by the semiconductor wafer.

For example, if the buried splitting layer contains a porous semiconductor material, the buried splitting layer may be formed by means of locally masking a part of the semiconductor wafer, e.g. with (photo) electrochemical etching. In addition or as an alternative, a partial groove may be created, wherein said partial groove only covers part of the surface of the semiconductor wafer. Afterwards, the buried layer may be deposited or grown (e.g., in the partial groove). This may result in a buried splitting layer comprising voids. For example, in the case of silicon as a semiconductor material, a silicon germanium layer can be formed. A further example includes wafer bonding (e.g. with a bonding layer including SiO2, Si3N4, graphite, molybdenum or combinations thereof). Furthermore, implantation may be exploited to alter the crystal structure of the semiconductor material. In general, the buried layer may have a high selectivity with respect to etching than the semiconductor material of the semiconductor wafer.

The buried splitting layer may be laterally centered at the semiconductor wafer and/or may extend laterally so that a distance from the buried splitting layer to an edge of the semiconductor wafer is at least 1 mm and/or at most 1 cm. The distance to the edge of the semiconductor wafer may be achieved by forming the buried splitting layer using a holder and/or a mask (e.g. hard mask), for example.

The method may further comprise removing (e.g., by grinding or etching) a part of the semiconductor wafer so that (e.g., until) a part of the buried splitting layer is uncovered. In one example, the semiconductor wafer is removed starting at an outer edge of the semiconductor wafer. The buried splitting layer may be removed by etching through the uncovered part of the buried splitting layer so that the semiconductor wafer is split along the buried splitting layer. In this way, the thickness of the semiconductor wafer can be reduced.

The splitting region may reach to an edge of the semiconductor wafer. Alternatively, the splitting region might not extend to an edge (e.g. at the circumference) of the semiconductor wafer. In one example, the splitting region may be removed by etching. In addition or as an alternative, the splitting region may be removed by mechanical means, for example by grinding or chemical mechanical polishing, or may be remelted by means of laser thermal anneal.

The semiconductor wafer may break along the splitting region when mechanically loading two parts of the semiconductor wafer respectively opposite to the splitting region. Mechanical loading may include, but is not limited to, inducing stress, e.g. by distorting the two parts. For example, a first part of the two parts extends from the front side to the splitting region and a second part of the two parts extends from the splitting region to the back side of the semiconductor.

For example, the splitting region may comprise a porous semiconductor material, e.g. porous silicon. In one embodiment, the splitting region is a porous silicon layer. For example, the porous material may be formed by (photo) electrochemical anodization. Additionally, reducing the thickness may comprise inserting a liquid (e.g. water or liquid carbon dioxide) or steam into the porous silicon and reduce a temperature to extend a volume of the liquid and to break the porous layer for separating two parts of the semiconductor wafer. The splitting region may comprise two porous layers of different pore size and reducing the thickness may comprise separating the two porous layers by mechanically loading the two parts of the semiconductor wafer at the two sides of the splitting region.

For example, a very homogeneous thickness of the semiconductor wafer may be obtainable with a low variation of the thickness of the semiconductor wafer over a lateral extension of the semiconductor wafer. For example, a maximum thickness of the semiconductor wafer might differ from an average thickness of the semiconductor wafer after reducing 110 the thickness by at most 5% (or at most 3%, or at most 1%) of the average thickness of the semiconductor wafer. In this way, an improved uniformity of a device performance over the semiconductor wafer may be obtainable.

By reducing the thickness of the semiconductor wafer via a splitting region, the single semiconductor wafer may be split into a thin semiconductor wafer and a remaining wafer, wherein at least the thin semiconductor wafers may be used for forming one or more semiconductor devices. The remaining wafer may be used for forming another semiconductor wafer for forming further semiconductor devices. In this way, the start wafer may be reusable and the costs per wafer may be reduced. A recycling procedure may be needed before the reuse can be started.

Optionally, the method 100 may comprise forming an epitaxial semiconductor layer on the first side of the semiconductor wafer before reducing the thickness of the semiconductor wafer. The epitaxial semiconductor layer may be separated from the semiconductor wafer during the reduction of the thickness of the semiconductor wafer. A height of the epitaxial semiconductor layer may be a height of a semiconductor wafer after reducing the thickness. At least a part of the epitaxial semiconductor layer may be used to form a drift region of a vertical semiconductor device to be formed. For example, after separating the epitaxial semiconductor layer from the remaining semiconductor wafer, the remaining semiconductor wafer may be reused as a start substrate for forming a further epitaxial semiconductor layer.

Placing 120 the carrier structure may comprise attaching a mechanical stable carrier (e.g. glass, tape or similar) to the semiconductor wafer (e.g. the front side of the semiconductor wafer). The carrier structure may be coated with glue, e.g. by adding glue or a double-sided adhesive foil to a side of the carrier structure to be attached to the semiconductor wafer. The carrier structure placed on the semiconductor wafer may be removable from the semiconductor wafer, e.g. by using thermal glue for attaching the carrier structure.

Optionally, the method may comprise removing the carrier structure from the first side of the semiconductor wafer. The carrier structure may be removed after providing 130 the support structure. After removing the carrier structure, the first side of the semiconductor wafer may be further processed or electrical element structure on the first side of the semiconductor wafer may be tested or measured.

For example, a single or a plurality of semiconductor devices may be formed on the semiconductor wafer. The plurality of semiconductor devices may be separated from each other (e.g. by dicing or sawing the semiconductor wafer) after removing the support structure.

For example, the method may further comprise forming one or more electrical element structures (e.g. transistors and/or diodes) of one or more semiconductor devices at the first side of the semiconductor wafer. For example, the method may comprise implanting doping regions (e.g. source/drain regions, emitter/collector regions and/or anode/cathode regions) and forming gates and/or wiring layers and/or metallization layers. The electrical element structure may be formed before forming the support structure and/or before reducing the thickness of the semiconductor wafer.

For example, the method may further comprise forming at least a part of at least one electrical element structure on the semiconductor wafer and/or performing electrical testing of the at least one electrical element structure formed on the semiconductor wafer while the semiconductor wafer is mechanically supported by the support structure.

The one or more semiconductor devices to be formed may be power semiconductor devices. For example, an electrical element structure (e.g. transistor and/or diode) of the semiconductor device and/or the power semiconductor device may have a breakdown voltage or blocking voltage of more than 10V (e.g. a breakdown voltage of 10 V, 20 V or 50V), more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V, 2000V, 3300V or 6500V), for example.

The semiconductor wafer may be a silicon wafer. Alternatively, the semiconductor wafer may be a wide band gap semiconductor wafer having a band gap larger than the band gap of silicon (1.1 eV). For example, the semiconductor wafer may be a silicon carbide wafer, or gallium arsenide wafer, or a gallium nitride wafer.

Figure 2:
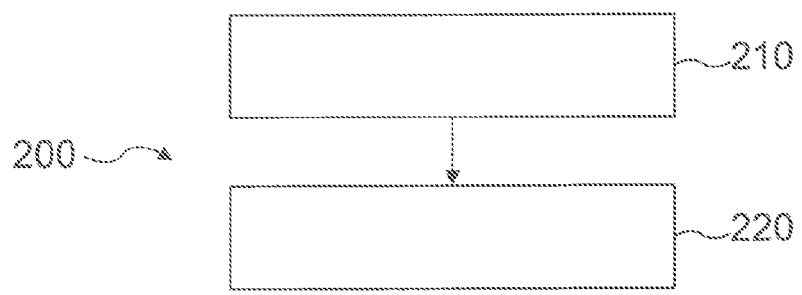
FIG. 2 shows a flow chart of an embodiment of a method for processing a semiconductor wafer comprising forming a support structure at a back side of the semiconductor wafer.

FIG. 2 shows a flow chart of an embodiment of a method 200 for processing a semiconductor wafer. The method 200 may comprise attaching a carrier structure to a front side 210 of the semiconductor wafer. The method 200 may further comprise forming a support structure on a back side 220 of the semiconductor wafer.

For example, the semiconductor wafer may be a thinned semiconductor wafer (e.g. with a thickness of at most 500 µm) or a semiconductor wafer to be thinned. The front side of the semiconductor wafer may comprise an electrical element structure. For forming a thin semiconductor wafer, a thickness of the semiconductor wafer may be reduced before or after attaching the carrier structure. The carrier structure may be attached to the front side to facilitate forming the support structure on the back side 220.

The support structure may be formed at the back side of the semiconductor wafer. For example, the back side may comprise unstructured semiconductor material, e.g. a substrate material of the semiconductor wafer. For example, providing or applying the support structure to the back side may increase a mechanical stability of the semiconductor wafer while facilitating further processing and/or performing electrical testing of the electrical element structure at the front side of the semiconductor wafer. For electrically testing the electrical element structure, the carrier structure may be removed from the front side after providing the support structure on the back side.

More details and aspects are mentioned in connection with the embodiments described above or below. The embodiments shown in FIG. 2 may comprise one or more optional additional features corresponding to one or more aspects mentioned in connection with the proposed concept or one or more embodiments described above or below (e.g. FIGS. 1 and 3 to 12g).

Figure 3:
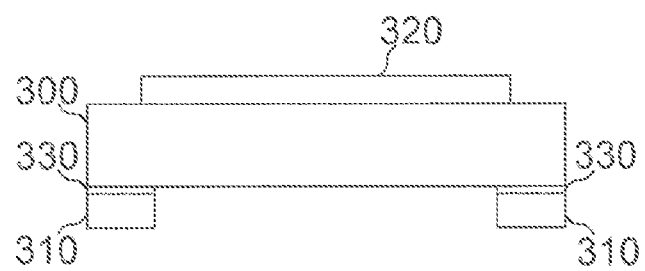
FIG. 3 shows a schematic illustration of an embodiment of a semiconductor composite structure with a support structure.

FIG. 3 shows a schematic illustration of an embodiment of a semiconductor composite structure with a semiconductor wafer 300 and a support structure 310 in a cross-sectional view. The semiconductor wafer 300 may comprise an electrical element structure 320 of a semiconductor device formed at a front side of the semiconductor wafer. The semiconductor wafer 300 may further comprise a support structure 310 located at a back side of the semiconductor wafer. A material of the support structure may differ from a material of the semiconductor wafer. Alternatively or additionally a connecting layer 330 may be located between the semiconductor wafer 300 and the support structure 310. The support structure 310 may increase a mechanical stability of the semiconductor wafer 300. The connecting layer 330 located between the semiconductor wafer 300 and the support structure 310 may facilitate removing the support structure 310 from the semiconductor wafer 300. For example, for further processing of the semiconductor wafer 300 (e.g. dicing), the support structure 310 may be removed from the semiconductor composite structure.

For example, the material of the semiconductor wafer 300 may be a semiconductor material, e.g. comprising silicon, and the material of the support structure 310 may be one of glass, sapphire, ceramic, carbon, plastic, and metal. The connecting layer 330 may be an adhesive layer and/or a melted layer, e.g. melted by laser melting. The adhesive layer may be one of glue, thermal glue, adhesive tape, and solder. The connecting layer 330 may fix the support structure 310 to the semiconductor wafer 300. It may be possible to remove the support structure 310 from the semiconductor wafer 300 by heating the connecting layer 330, e.g. in order to soften or melt a connecting compound (e.g. thermal glue or solder) of the connecting layer 330.

Optionally, a maximum height of a cross section of the support structure 310 is larger than a thickness of the semiconductor wafer 300. For example, the maximum height is at least 20% (or at least 40%, at least 80% or at least 200%) larger and/or at most 300% (or at most 200% or at most 100%) larger than the thickness of the semiconductor wafer 300.

For example, the support structure 310 may comprise the same material as the semiconductor wafer 300. In this case, a crystallization structure of the support structure may differ from a crystallization structure of the semiconductor wafer at a boundary layer between the support structure and the semiconductor wafer.

A diameter of the support structure may differ by at most 5% (or at most 2%, at most 1% or at most 0.5%) from a diameter of the semiconductor wafer. Alternatively, a diameter of the support structure may be larger (e.g. 5% larger) than the diameter of the semiconductor wafer. A diameter of the support structure larger than the diameter of the semiconductor wafer may provide improved edge protection to the semiconductor wafer.

More details and aspects are mentioned in connection with the embodiments described above or below. The embodiments shown in FIG. 3 may comprise one or more optional additional features corresponding to one or more aspects mentioned in connection with the proposed concept or one or more embodiments described above or below (e.g. FIGS. 1, 2 and 4a to 12g).

Figure 4A:
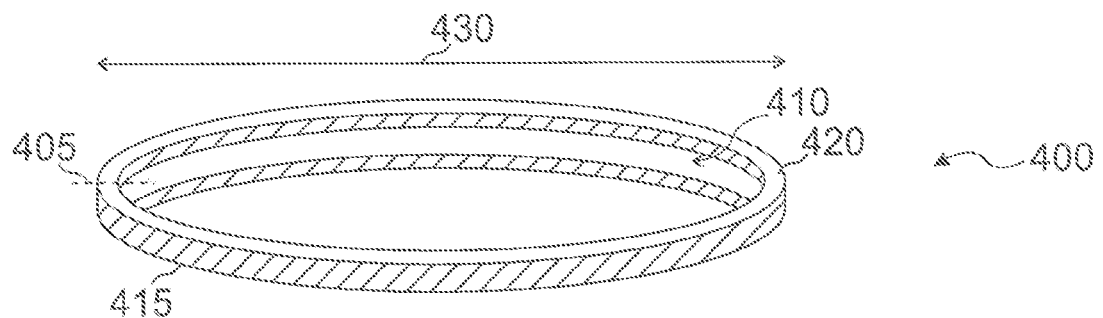
FIG. 4a shows a schematic illustration of an embodiment of a support structure for a semiconductor wafer.
Figure 4B:
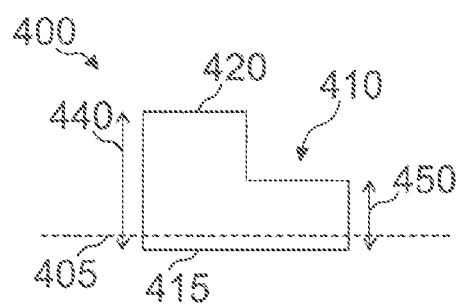
FIG. 4b shows a schematic illustration of a cross section of an embodiment of a support structure.

FIG. 4a shows a schematic illustration of an embodiment of a support structure 400 with a cross section 405 of the support structure 400, shown in FIG. 4b. The support structure 400 is configured for supporting a semiconductor wafer (e.g. semiconductor wafer 300 shown in FIG. 3). A maximum height 440 of the cross section 405 of the support structure 400 may be at least 0.1 mm (or at least 0.5 mm, at least 1 mm, at least 2 mm, at least 5 mm or at least 20 mm) and/or at most 30 mm (or at most 20 mm, at most 10 mm, at most 5 mm or at most 2 mm). Optionally, a minimum height 450 of the cross section 405 of the support structure 400 may be smaller than the maximum height 440.

A cross sectional area of the support structure 400 may be step shaped. For example, the support structure 400 may comprise an inner step 410 with a surface of the inner step 410 located closer to a bottom 415 of the support structure 400 than a top surface 420 of the support structure 400. An outer diameter 430 of the support structure 400 may differ from a diameter of a semiconductor by at most 4% (or by at most 2%, by at most 1% or by at most 0.5%).

Figure 4C:
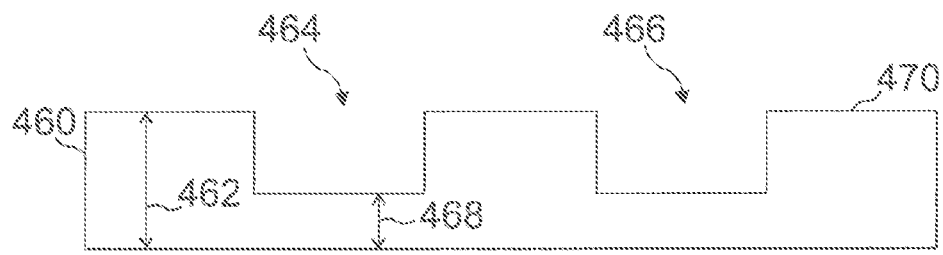
FIG. 4c shows a schematic illustration of an embodiment of a support structure with varying thickness.
Figure 6:
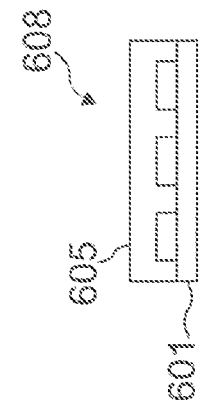
FIG. 6a-6e show an embodiment of a method for processing a semiconductor wafer comprising reducing a thickness of the semiconductor wafer by thinning the semiconductor wafer.
Figure 6:
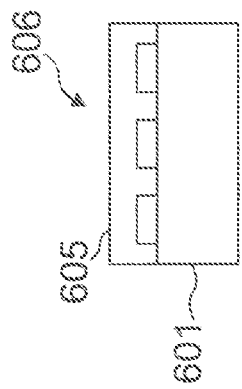
Figure 6:
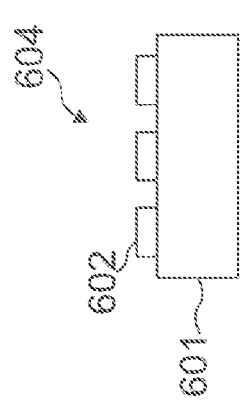
Figure 6:
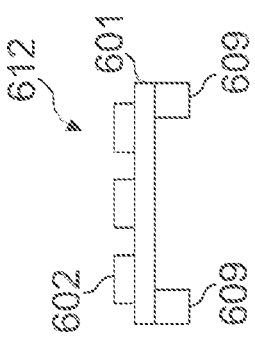
Figure 6:
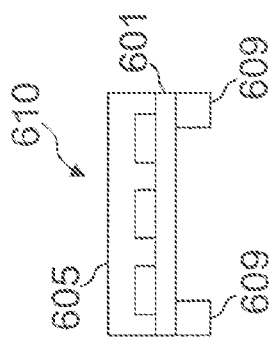
Figure 7:
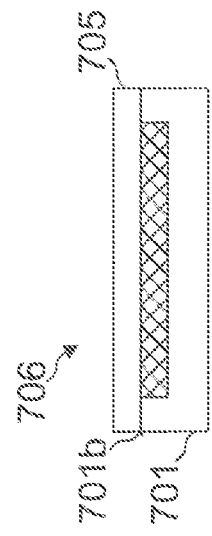
FIG. 7a, 7b, 7c, 7d, 7e, 7f, 7g, 7h, 7i, 7i', and 7j show an embodiment of a method for processing a semiconductor wafer comprising reducing a thickness of the semiconductor wafer by separating two parts of the semiconductor wafer along a buried splitting layer of the semiconductor wafer.
Figure 7:
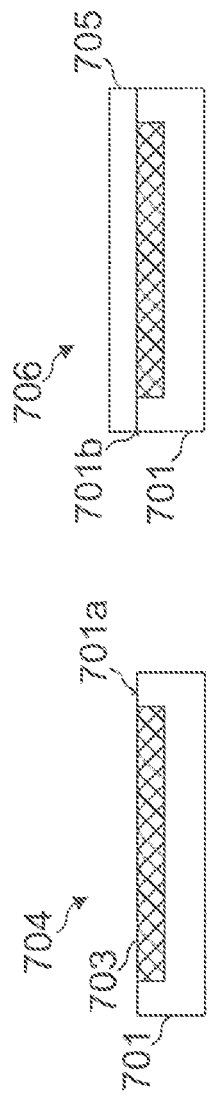
Figure 7:
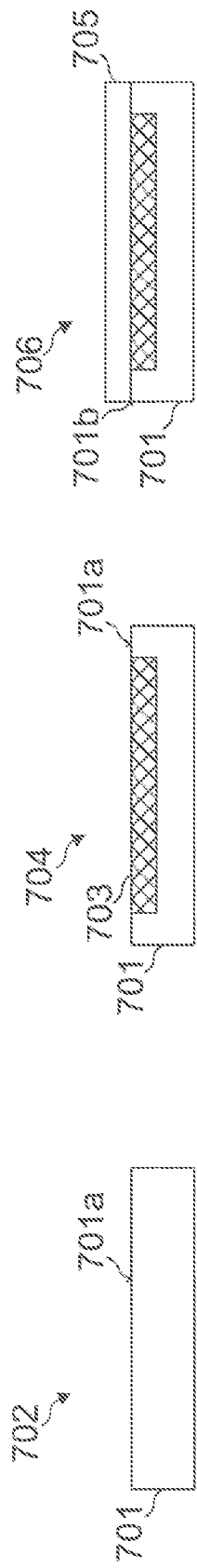
Figure 7:
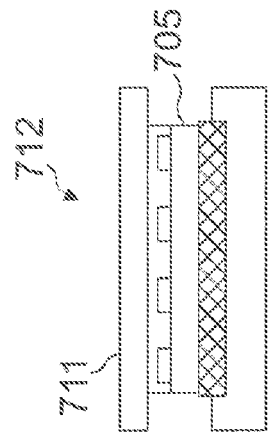
Figure 7:
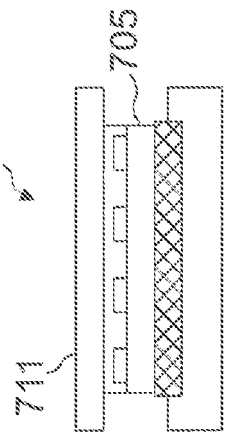
Figure 7:
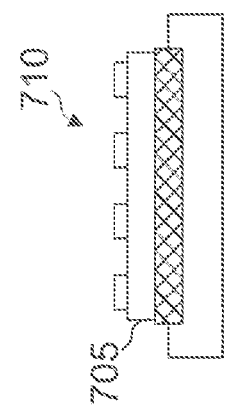

FIG. 4c shows a schematic illustration of an embodiment of a support structure 460 with a varying thickness. FIG. 4c shows the support structure 460 from a side view perspective. The height of the support structure 460 may vary along a circumference of the support structure 460. Parts of the support structure 460 may have a first thickness 462, while other parts of the support structure 460 have a second thickness 468. The support structure 460 may comprise a plurality of notches or ducts 464, 466 at parts having the second thickness 468, which is smaller than the first thickness 462. For example, the second thickness 468 may be less than 80% (or less than 60%) of the first thickness 462. The ducts may be provided around the support structure 460, e.g. along an outer frame of the support structure 460 or along a circumference of a circular support structure 460. The ducts may be distributed in equal distance to the respective next ducts. That is to say, the ducts 464, 466 may be distributed homogeneously along the outer frame of the support structure 460, so that the thickness of the support structure 460 changes periodically along the outer frame. The support structure 460 may be attached to the semiconductor wafer with a side 470 comprising the ducts 464, 466 facing towards the semiconductor wafer. Alternatively, the support structure 460 may be attached to the semiconductor wafer with the side 470 comprising the ducts 464, 466 facing away from the semiconductor wafer.

Even though the support structure 460 with varying thickness of FIG. 4c has been explained in connection with the ring-shaped support structure 400 shown in FIGS. 4a and 4b, it will be appreciated by a person skilled in the art that the support structure 460 may also have a different geometry, e.g. a polygonal shape.

More details and aspects are mentioned in connection with the embodiments described above or below. The embodiments shown in FIG. 4a to FIG. 4c may comprise one or more optional additional features corresponding to one or more aspects mentioned in connection with the proposed concept or one or more embodiments described above or below (e.g. FIGS. 1 to 3 and 5a to 12g).

FIG. 5a-5g show schematic cross sections of a semiconductor wafer during manufacturing. A thickness of the semiconductor wafer may be reduced by separating two parts of the semiconductor wafer, e.g. splitting the semiconductor wafer.

According to a method shown in FIG. 5a-5g, a wafer comprising a start substrate 501, an auxiliary layer 502, and an epitaxial (EPI) layer 503 may be provided 504. Subsequently, front side processes may be executed 504. For example, at least one electrical element structure 505 may be formed. A carrier system 507 (e.g. reversible) may be deposited 508 onto the front side. Selective etching of the auxiliary layer may be executed 510. Subsequently, further back side processes like e.g. lithography, ion implantation, laser thermal anneal (LTA), etc. may be executed 512. The method may comprise depositing 514 a support ring 513 on the wafer back side. The method may further comprise removing 516 the reversible carrier 507. Further processing like standard technologies may be executed. For example, depositing metal, lithographic process or the electrical element structure 505 may be electrically tested while the support ring 513 mechanically supports the semiconductor wafer provided by the method.

Optionally, it may be possible to mechanically separate 510' the auxiliary layer 502, e.g. a remaining auxiliary layer 502' (shown in FIG. 5d') may be removed after separating the auxiliary layer 502. In case of porous silicon separating could e.g. be done by filling the cavities with a liquid like e.g. water (possibly also water vapor) which may be subsequently cooled down below freezing point. The porous silicon layer may e.g. consist of a 2-layered structure, wherein one layer e.g. comprises relatively small pores and may well be overgrown and the second layer comprises relatively large pores. Optionally, separating the substrate wafer may take place by depositing tension-generating layers (similar to a so-called cold split method) which consequently may split up the area of larger pores.

The auxiliary layer may e.g. consist of silicon dioxide (SiO2) (if present as silicon on insulator (SOI) or a bonded substrate), silicon germanium (SiGe) or porous silicon. The reversible carrier may be a foil, a glass carrier carbon or the like. The support structure, for example a support ring, on the back side may consist of: glass, sapphire, silicon, ceramics, carbon, plastics or metal. In case of a transparent ring it may be fixed by means of e.g. UV-hardening adhesive. In case of a non-transparent ring thermal adhesive, glass solder, metal adhesive or the like may be applied. The support ring may be placed on the front side. The support ring may be recycled after lifting off the ring. For a support ring made of glass, for example, the silicon on the ring may be selectively removed by means of an alkaline etchant. Likewise, with other ring materials selective recycling methods may be possible.

According to other methods, a center region of the semiconductor wafer may be grinded for thinning the center region of the semiconductor wafer and forming a support ring for the thin semiconductor wafer around the center region while the grinded semiconductor material might be no longer useful. Providing 130 the support structure may enable to form the thin semiconductor wafer out of a starting substrate (e.g. a semiconductor wafer thicker than the thin semiconductor wafer) while a remaining material of the starting substrate may be further used, for example for forming further thin semiconductor wafers out of the remaining substrate material. Increased mechanical stability may be provided for the thin semiconductor wafer while preventing high consumption of semiconductor material, e.g. due to grinding. An amount of semiconductor material needed for forming a thin semiconductor wafer with increased mechanical stability may be reduced and costs may be reduced.

More details and aspects are mentioned in connection with the embodiments described above or below. The embodiments shown in FIGS. 5a to 5g may comprise one or more optional additional features corresponding to one or more aspects mentioned in connection with the proposed concept or one or more embodiments described above or below (e.g. FIGS. 1 to 4c and 6a to 12g).

FIG. 6a-6e show an embodiment of a method for processing a semiconductor wafer, wherein a thickness of the semiconductor wafer is reduced by thinning the semiconductor wafer.

The method may show an application of a proposed concept to power semiconductors, e.g. MOSFETs, IGBTs and/or diodes. A thick wafer 601 (e.g. with a thickness larger than 0.4 mm or a thickness depending on the diameter of the semiconductor wafer) with an electrical element structure 602 may be provided 604. A reversible carrier 605 may be attached 606 to a front side of the thick wafer. A thickness of the thick wafer may be reduced 608 to provide the wafer with a final thickness. A support ring 609 may be attached 610 to the back side of the wafer. The reversible carrier 605 may be removed 612.

More details and aspects are mentioned in connection with the embodiments described above or below. The embodiments shown in FIGS. 6a to 6e may comprise one or more optional additional features corresponding to one or more aspects mentioned in connection with the proposed concept or one or more embodiments described above or below (e.g. FIGS. 1 to 5g and 7a to 12g).

FIG. 7a-7j show an embodiment of a method for processing a semiconductor wafer, wherein a thickness of the semiconductor wafer is reduced by separating two parts of the semiconductor wafer along a buried splitting layer of the semiconductor wafer.

The method may be used for manufacturing semiconductor devices, e.g. example power semiconductor devices, e.g. MOSFETs, an insulated gate bipolar transistor (IGBT) and or a diode based on epitaxial (EPI) growth. A start wafer 701 (e.g., a semiconductor wafer) may be provided 702 (FIG. 7a). A splitting region 703 may be formed in the start wafer 701 (FIG. 7b). In particular, the splitting region 703 may be formed at a first side 701a of the semiconductor wafer 701.

The splitting region 703 might not be generated over the entire area of the start wafer 701. Instead, the buried splitting layer 703 may be generated only at a part of the front side of the start wafer 701, in particular at a central part of the start wafer 701 (e.g. using a holder and/or a hard mask).

After generating 704 the splitting region 703, an epitaxial layer 705 (e.g., a device EPI layer, which may include a field stop) may be deposited 706 (e.g., grown) on the splitting region 703 and/or the start wafer 701 (FIG. 7c). The splitting region 703 may then be buried between the semiconductor wafer 701 and the epitaxial layer 705, thus forming a buried splitting layer 703.

If required, the epitaxial layer 705 may be post-processed (e.g. using chemical-mechanical polishing (CMP), not shown). Post-processing may be required if the surface roughness is not sufficient for further processing. Then, all front-side processes may be executed 708 (e.g. for providing an electrical element structure 709, FIG. 7d).

In a subsequent step (shown in FIG. 7e), access to the splitting layer 703 may be provided 710 (e.g. by front side edge grinding, laser or plasma). For example, access is provided 710 by removing part of the semiconductor wafer 701 and/or the epitaxial layer 705. Removing may start at an outer edge 701b of the semiconductor wafer 701. Embodiments for providing an access 710 to the splitting layer may include: grinding until the splitting layer is visible (not depicted in FIG. 7e); stop grinding in the splitting layer (see FIG. 7e); or grinding until start substrate below splitting layer is visible (not depicted in FIG. 7e).

Then, a reversible carrier 711 may be deposited 712 at the front side of the epitaxial layer 705 (e.g. without coating the side walls of the epitaxial layer). Separation (e.g. by etching or mechanical load) of start substrate 701 and device layer 705 may be executed 714. The processes on the back side may now be executed 716. As the device layer (thin wafer) may have a smaller diameter than a semiconductor equipment and materials international (SEMI) standard, a support ring 717 may be applied to the back side 718. This ring might not only serve to fulfil a SEMI standard (diameter) but also serve as a mechanical stabilization and protection of the thin wafer. Subsequently, the reversible carrier 711 may be removed 720 and further processes may be executed as with standard technologies. For example, the electrical element structure 709 may be electrically tested and/or metal may be deposited and/or lithographic processes may be performed.

For example, the buried splitting layer may be formed before an epitaxial semiconductor layer is formed on the first side of the semiconductor wafer. The buried splitting layer may extend laterally over more than 70% (or more than 80% or more than 90%) of a lateral area of the semiconductor wafer. The buried splitting layer might not extend laterally to an edge of the semiconductor wafer, but may end at a distance from the edge. For example, a lateral distance between the buried splitting layer and the edge of the semiconductor wafer may be at least 1 mm (or at least 2 mm or at least 5 mm) and/or at most 2 cm (or at most 1 cm or at most 5 mm). The distance to the edge of the semiconductor wafer may be achieved by forming the buried splitting layer using a holder and/or a mask (e.g. hard mask), for example. The method may further comprise removing (e.g. by grinding or etching) a part of the semiconductor wafer until a part of the buried splitting layer is uncovered. This process may be carried out starting from a side wall, e.g. an edge, of the semiconductor wafer and/or the epitaxial layer. The buried splitting layer may be removed by etching the buried splitting layer through the uncovered part of the buried splitting layer so that the semiconductor wafer is split along the buried splitting layer.

The buried splitting layer may be silicon germanium (SiGe) or porous silicon. The splitting layer may e.g. be a porous silicon layer and e.g. consist of a 2-layered structure wherein e.g. one layer comprises relatively small pores and may easily be overgrown and the second layer comprises rather large pores.

Optionally, separating the substrate wafer may e.g. also be done by depositing tension-generating layers (similar to a so-called cold split method) which consequently split up the area of larger pores. Alternatively, in case of porous silicon the separating process may e.g. be done by filling the cavities with a liquid, like e.g. water (possibly also water vapor) which may be subsequently cooled down below its freezing point.

The reversible carrier may be a foil, a rigid carrier (e.g. glass) or a combination of double-sided adhesive tape with a mechanically stable carrier. For the side walls not to be coated, the following variants may be used: printing an adhesive; applying an adhesive by means of edge deletion and back side rinsing, applying an adhesive during the presence of a reassembable protection part (e.g. a protection ring provided during coating and removed after coating, the protection ring e.g. comprising two engaged semi-circle elements being easily separable) and/or by means of spin coating with edge removal/rinsing; rigid substrate may be provided with a double-sided adhesive tape (e.g. sensitive to temperature or ultra violet (UV) radiation), wherein the adhesive area may be as large as the diameter of the device layer The support ring on the back side may consist of: glass, sapphire, silicon, ceramics, carbon, possibly temperature-resistant plastics and/or metal. In case of a transparent ring it may be applied by means of e.g. UV-hardening adhesive. In case of a non-transparent ring, thermal adhesive, glass solder, metal adhesive or the like may be applied. The support ring may alternatively also be applied directly to the wafer (e.g. plastics-based) by laser-induced local polymerization from a solution into which the wafer is introduced. Alternatively, the ring may be applied ceramically or metallically by sintering.

Optionally, a ring 717' may be applied 718' by using a generative manufacturing process (3D printing). The ring 717' might be removed e.g. using a ring laser process and may enclose the wafer from the bottom and from the side.

More details and aspects are mentioned in connection with the embodiments described above or below. The embodiments shown in FIGS. 7a to 7j may comprise one or more optional additional features corresponding to one or more aspects mentioned in connection with the proposed concept or one or more embodiments described above or below (e.g. FIGS. 1 to 6e or 8 to 12g).

For example, it may be required to form semiconductor devices, e.g. semiconductor chips or semiconductor wafers, with a thickness, e.g. a final thickness, of less than 70 µm. To reduce complexity while processing such semiconductor devices and/or to increase a yield of formed semiconductor devices, carriers and/or support structures may be provided for the semiconductor wafer.

According to some concepts, a support structure may be connected to a wafer by using glue, epoxy, or glass frit bonding, e.g. depending on which side of the semiconductor wafer the support structure is connected to the wafer. In some of these cases, process constraints may occur, e.g. relating to temperature limits. In some cases, e.g. when using glue (or, in general, an adhesive), limitations relating to sputter processes or depositing processes may arise. For example, it may be difficult to form some kinds of back side metallization. When using glue for connecting the support structure with the semiconductor wafer, e.g. emission of gas may occur from the connection region at high temperatures.

Figure 8:
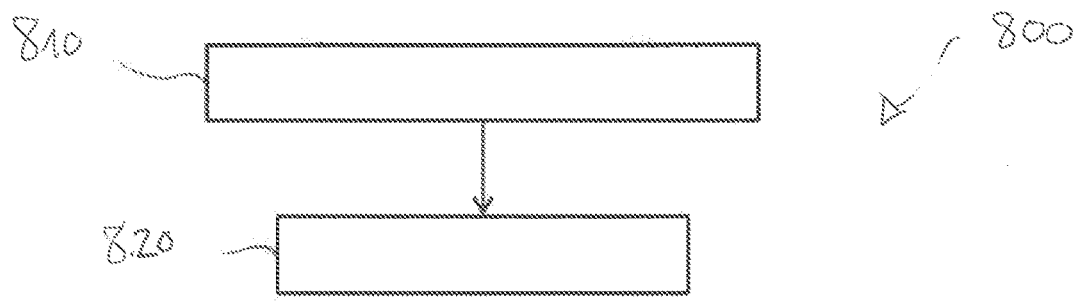
FIG. 8 shows a flow chart of an embodiment of a method for processing a semiconductor wafer comprising welding at least one support structure onto a semiconductor wafer.

FIG. 8 shows a flow chart of an embodiment of a method 800 for processing a semiconductor wafer. The method 800 for processing the semiconductor wafer may comprise welding 810 at least one support structure onto the semiconductor wafer. Further, the method 800 may comprise reducing 820 a thickness of the semiconductor wafer. For example, the thickness of the semiconductor wafer may be reduced 820 before or after welding the at least one support structure onto the semiconductor wafer.

By welding 810 the at least one support structure onto the semiconductor wafer, the at least one support structure and the semiconductor wafer may be joined together. For example, a weld region (e.g., a connection region) may be formed at an interface of the at least one support structure and the semiconductor wafer. For example, within the weld region materials of the semiconductor wafer and the support structure may be merged. In additional or alternative examples, a joining structure may be positioned between the semiconductor wafer and the support structure. Said joining structure may be welded to at least one of the support structure and the semiconductor wafer, wherein the weld region then is formed at an interface of the support structure and the joining structure or the semiconductor wafer and the joining structure, respectively. Within the weld region, respective materials of the semiconductor wafer and the joining structure and/or of the support structure and the joining structure may be merged (e.g. welded and/or fused and/or molten). In general, welding 810 may result in an inseparable and/or irreversible connection of the support structure and the semiconductor wafer.

For example, welding 810 (e.g. comprising laser welding, laser beam welding, or laser micro-welding) may comprise melting material of two adjoining components at an interface between said two adjoining components. For example, at least within a portion of the interface, material of the two adjoining components may melt during welding 810. The two adjoining components may be the at least one support structure and the semiconductor wafer, the at least one support structure and the joining structure and/or the semiconductor wafer and the joining structure. For example, welding 810 may cause melting of material at opposite surfaces of the two components contacting each other. The materials of the contacting surfaces (e.g. thin surface layers) may melt for a short duration of time. Within this duration of time, the melted materials of the two components may fuse and form a bond, e.g. the weld region, when cooling down and solidifying. Welding 810 the two components may not require an adhesive, such as for example glue. Therefore, the weld region may be free of an adhesive.

Welding 810 the at least one support structure onto the semiconductor wafer may result in a stable and permanent connection of the semiconductor wafer and the support structure. For example, an irreversible bond may be achieved. For example, it might not be possible to remove the support structure from the semiconductor wafer after welding. The support structure may be removed only by destroying at least one of the semiconductor wafer and the support structure, for example.

For example, when welding 810 the support structure onto the semiconductor wafer, the semiconductor wafer together with the bonded support structure may be processed at higher temperatures compared to semiconductor wafers with non-welded support structures. Welding may enable a temperature-stable bond between the support structure and the semiconductor wafer, for example. Compared to other concepts for connecting a support structure and a semiconductor wafer, gas emission (as it may occur in combination with other connecting methods, e.g. using glue) may be avoided by welding 810 the support structure. In particular, limitations during processing that may occur due to the use of an adhesive (e.g., glue, such as inorganic glue) may be avoided by using welding for connecting the support structure and the semiconductor wafer.

The thickness of the semiconductor wafer may be reduced 820 before or after welding 810 the at least one support structure onto the semiconductor wafer. For example, when reducing the thickness after welding 810 the at least one support structure onto the semiconductor wafer, the at least one support structure may mechanically support the semiconductor wafer during reducing 820 the thickness of the semiconductor wafer. For example, when reducing 820 the thickness of the semiconductor wafer after welding 810 the at least one support structure onto the semiconductor wafer, the support structure may mechanically support the thinned, e.g. mechanically fragile, semiconductor wafer.

Welding 810 the support structure to the semiconductor wafer, may replace other concepts of connecting a support with a wafer, e.g. adhesive layers or glass frit bonding. Welding 810 (e.g. of glass structures) may create an irreversible bond, e.g. between the support structure and the semiconductor wafer. For example, effects of gas release or temperature constraints of processing the semiconductor wafer with the connected support structure may be reduced and/or avoided due to welding 810 the support structure onto the semiconductor wafer.

For example, welding 810 may comprise placing the at least one support structure on the semiconductor wafer. The support structure may be put onto a surface of the semiconductor wafer. For example, placing the at least one support structure on the semiconductor wafer may comprise mechanically fixing the at least one support structure on the semiconductor wafer in a welding position, e.g. to position the support structure accurately for welding.

Further, welding 810 may comprise irradiating light through the at least one support structure or through the semiconductor wafer. Typically, light is irradiated through the support structure. By irradiating light through the support structure or the semiconductor wafer, a weld region may form at an interface of the at least one support structure and the semiconductor wafer or at an interface of the support structure and a joining structure or at an interface of the semiconductor wafer and a joining structure.

For example, light of a first wavelength is irradiated through the at least one support structure, e.g. in a direction towards the semiconductor wafer and/or the joining structure. In addition or as an alternative, light of the first wavelength may be irradiated through the semiconductor wafer, e.g. in a direction towards the at least one support structure and/or the joining structure. The light may be focused to a region where the weld region is to be formed (e.g., an interface between the semiconductor wafer and the support structure or the semiconductor wafer and the joining structure or the support structure and the joining structure).

The light of the first wavelength may be infrared light or near-infrared light, for example. The first wavelength may be at least 800 nm, or at least 1000 nm or at least 1300 nm. The first wavelength may be at most 3 µm or at most 2 µm or at most 1.8 µm. Typically, the first wavelength is between at least 1000 nm and at most 1200 nm or between at least 1400 nm and at most 1600 nm. For example, at least 50% (or at least 60%, at least 70%, at least 80%, or at least 90%) of the light of the first wavelength may pass through the at least one support structure or through the semiconductor wafer and/or may reach the weld region, for example. The support structure and/or the semiconductor wafer may be substantially transparent at least for light of the first wavelength. In this context, a component may be "substantially transparent" for light of a specific wavelength if said component has a transmittance of at least 50% or at least 60% or at least 70% for light of said specific wavelength. For example, the light may be laser light and/or the first wavelength may be a peak wavelength of the light.

The light may irradiate through the support structure or through the semiconductor wafer and may be absorbed at the interface of the support structure and the semiconductor wafer and/or at a joining structure positioned between the support structure and the semiconductor wafer. At the interface between the support structure and the semiconductor wafer and/or at the joining structure, an absorption coefficient for light of the first wavelength may be high, at least compared to the absorption coefficient of the support structure and/or the semiconductor wafer. For example, a material of the semiconductor wafer in a region at the interface and/or the joining structure may have a higher absorption coefficient (e.g., at least 10 times higher or at least 100 times higher) than the material of the support structure.

For example, the joining structure may comprise or may be an absorption layer. The absorption layer may be located at the interface, e.g. on the surface of the semiconductor wafer and/or on the surface of the support structure. The absorption of light at the absorption layer may generate heat at the interface of the absorption layer and the semiconductor wafer or at the interface of the absorption layer and the support structure so that the surfaces of the semiconductor wafer and the absorption layer or the surfaces of the absorption layer and the support structure melt and the weld region is formed, for example.

The light for welding may be provided by a laser emitting light with a peak wavelength (e.g. the first wavelength) of at least 800 nm and/or at most 1200 nm. The laser light may be used directly for laser welding or may be shifted in frequency (e.g., frequency doubled and/or frequency shifted) before laser welding. For example, the light (e.g. laser light) may be emitted in pulses having a pulse length of less than 1 µs or less than 100 ns. Typically, the pulse length is less than 10 ns (or less than 1 ns, or less than 100 ps, or less than 10 ps). The pulse length may even be below 1 ps, i.e. in the femtosecond regime. A pulse energy and/or a repetition rate of the laser light may be chosen appropriately depending on the pulse length. For example, the pulse energy may be at least 0.1 µJ/pulse for a pulse length of below 1 ps. The repetition rate may be in the kHz regime or even in the MHz regime. In other embodiments, however, the laser light may be continuous wave (CW) or quasi-continuous wave, e.g. with a pulse length above 1 µs or above 10 µs. In some embodiments, the laser may be a fiber laser.

For example, laser welding and/or micro welding, e.g. laser micro-welding, may be used. Laser welding may be based on an infrared or near-infrared laser with very short laser pulses (e.g. in the range of nanoseconds or picoseconds). Other laser systems and/or other wavelengths may, however, be exploited as well. Micro-welding may enable to melt only small local regions (e.g. heat affected zones) and may enable to form a highly accurate weld region, for example.

For example, a material of the support structure may be substantially transparent for light of the first wavelength, e.g. (near-) infrared laser light. In addition or as an alternative, a semiconductor material of the semiconductor wafer (e.g. a wide band gap semiconductor, e.g. silicon carbide) may be substantially transparent for the used laser light. In order to enable welding 810 the support structure onto semiconductor wafers of material that is substantially transparent for the irradiated light, it may be necessary to form an absorption region at the weld region. The absorption region may comprise or may be an absorption layer, e.g. a structured absorption layer. A geometry of the absorption region may correspond to a geometry of the support structure, for example. In some examples, the support structure may be ring-shaped or grid-shaped. In this case, the absorption region may also be ring-shaped or grid-shaped, respectively.

The method may e.g. further comprise forming an absorption region on the semiconductor wafer and/or on the at least one support structure. The absorption region may be formed before the welding process. For example, the absorption region may be formed on the semiconductor wafer before placing the support structure on the semiconductor wafer.

The absorption region may be formed at the front side and/or the back side of the semiconductor wafer.

For example, the absorption region may comprise a silicide layer. For example, the silicide layer may be non-transparent or at least less transparent than the support structure for light of the first wavelength. Hereinafter, "non-transparent" for light of a specific wavelength may mean that the absorption layer has an absorption coefficient of at least 70% or at least 80% or at least 90% or even at least 95% for light of said specific wavelength. The silicide layer may be or may comprise e.g. a nickel silicide layer, a cobalt silicide layer, a tantalum silicide layer and/or a titanium silicide layer. For example, the silicide layer may be formed on a back side of the semiconductor wafer. The silicide layer may be formed having a thickness of at least 10 nm (or of at least 30 nm, at least 45 nm, at least 60 nm, at least 70 nm, at least 90 nm, or at least 120 nm) and/or of at most 250 nm (or at most 220 nm, at most 180 nm, at most 150 nm, at most 120 nm, or at most 90 nm), for example. Such thicknesses may be generally used for the absorption layer and/or for an absorption structure, independent of the use of silicide.

The silicide layer may be formed on the back side of the semiconductor wafer to provide an ohmic contact metallization, for example for semiconductor devices of the semiconductor wafer. The silicide layer may efficiently enable a dual use for both an ohmic contact metallization and an absorption layer for welding the support structure, for example. For example, regions of the silicide layer that may be in contact with the support structure after placing the support structure on the semiconductor wafer, may form the absorption region, whereas other regions of the silicide layer may at least partly form an ohmic contact metallization of the semiconductor devices. The absorption region and/or the support structure may at least partly surround the ohmic contact metallization, e.g. in the case of a ring-shaped or grid-shaped support structure.

For example, the absorption region may comprise a silicon portion, e.g. a silicon layer. The silicon layer may be formed at a front side or back side of the semiconductor wafer, for example. The silicon layer may be a monocrystalline layer, a polycrystalline layer (e.g., so-called polysilicon) or an amorphous layer. The silicon layer may be doped or undoped. For example, an absorption coefficient of the silicon layer may depend on the doping concentration within the silicon layer. This may be particularly the case for polysilicon or amorphous silicon. The silicon layer may have a thickness of at least 2 µm (or at least 2.5 µm, at least 3 µm, or at least 4 µm) and/or of at most 5 µm (or at most 4 µm). For example, the silicon layer may be a structured layer. A mask may be used for forming the silicon layer and the silicon layer may be formed only within a laterally overlapping area of the support structure (e.g. a ring structure and/or a grid structure) and the semiconductor wafer, for example. The silicon layer may be formed within a radially outer region of the semiconductor wafer or may be formed having a grid structure, for example. Using a silicon layer as absorption layer may enable providing a low cost absorption layer and/or forming an absorption layer within a short time.

For example, the absorption region may comprise a highly doped implantation layer, e.g. having a doping concentration of at least $1 \cdot 10^{19}$ cm$^{-3}$ (or of at least $5 \cdot 10^{19}$ cm$^{-3}$, or of at least $1 \cdot 10^{20}$ cm$^{-3}$). The highly doped implantation layer may be located at a surface or may vertically extend into a surface a surface region of the semiconductor wafer, for example. Accordingly, the method may comprise implanting ions into a surface region of the semiconductor wafer to form the implantation layer with the high doping concentration at the surface. For example, the ions may be implanted through a mask layer to form a structured implantation layer. For example, the implantation layer may be formed only within an area overlapping with the support structure to be welded onto the semiconductor wafer. The implantation layer may be formed to have a high absorption coefficient at a wavelength for which the support structure is substantially transparent, for example.

For example, the support structure may be welded onto the semiconductor wafer after forming electrical element structures on the semiconductor wafer. The proposed method may comprise forming at least one electrical element structure of a semiconductor device at a front side of the semiconductor wafer. The electrical element structure may comprise at least one of: a gate of a transistor, a contact structure for contacting a doped region of the semiconductor device, a gate contact of a transistor, a wiring layer, a via element, a metal layer, or the like. The electrical element structure may be formed before reducing the thickness of the semiconductor wafer. Forming the electrical element structure may comprise forming a structure such as a silicon portion, e.g. a polycrystalline silicon portion, and/or a metallization portion (e.g. an electrical contact structure), for example.

For example, the absorption region may comprise a part of the polycrystalline silicon portion and/or the metallization portion. A polycrystalline silicon portion and/or a metallization portion may be formed around the semiconductor device to be formed (e.g. laterally between two semiconductor devices or in an edge region of the semiconductor wafer) while forming the electrical element structure (e.g. in a common process). Therefore, the absorption region may be efficiently formed during forming semiconductor devices of the semiconductor wafer and additional process steps may be avoided, for example.

Alternatively or additionally, it may be possible to form an absorption region as described above or below on the support structure. For example, the absorption region may be formed on a surface at a first side of the support structure and the first side of the support structure may face the semiconductor wafer or may be in contact with the semiconductor wafer during welding the support structure onto the semiconductor wafer. An absorption layer may be deposited on the support structure, for example. The absorption layer may contact the semiconductor wafer while welding 810 the support structure onto the semiconductor wafer. For example, the light used for welding may irradiate through the support structure and may be absorbed within the absorption layer positioned on the support structure. For example, the material of the absorption layer and/or the material of the semiconductor wafer and/or the material of the support structure in contact with the absorption layer may melt and form the weld region. Locating the absorption region at the support structure may facilitate forming the absorption region, for example.

For example, an absorption region (e.g. absorption layer) may be formed on both the semiconductor wafer and the support structure. Forming the absorption region on both the semiconductor wafer and the support structure may increase an absorption coefficient and/or may facilitate welding the support structure, for example. In this case, it may be possible that the weld region is formed between the two absorption regions, e.g. by melting material of the two absorption regions.

The at least one support structure may be used for mechanical support or stabilization of the semiconductor wafer, for example. The at least one support structure may be provided to protect the semiconductor wafer, e.g. edges of the semiconductor wafer, and/or to reduce a risk of damages (e.g. cracks) within the semiconductor wafer. For example, the at least one support structure may be formed on the front side and/or on the back side of the semiconductor wafer. Forming support structures on both sides of the semiconductor wafer may increase a mechanical support for the semiconductor wafer, for example.

For example, the at least one support structure may comprise or may be a ring structure or a grid structure. An outer diameter of the ring structure may be larger than an outer diameter of the semiconductor wafer, for example. In some examples, the outer diameter of the ring structure may be at least 105% (or at least 110% or at least 120% or even at least 130%) of an outer diameter of the semiconductor wafer. The support structure may radially overlap the semiconductor wafer and/or may radially protrude beyond the semiconductor wafer to protect an edge of the semiconductor wafer, for example. The at least one support structure may comprise glass or another material being (e.g. substantially) transparent at least for light of the first wavelength, for example silicon carbide. The support structure may be a glass structure. For example, if more than one support structure is used, the different support structures may comprise different materials. The material of the support structure may differ from a material of the semiconductor wafer at an interface between the semiconductor wafer and the support structure, e.g. to further increase an absorption of the irradiated light at the interface.

Separately or in combination, the at least one support structure may have a shape as discussed above or below. For example, the cross-sectional area of the support structure may be step shaped (e.g., as described in connection with FIG. 4*b*) and/or the support structure may have a varying thickness (e.g., as described in connection with FIG. 4*c*). The weld region may, for example, be formed in a region of the support structure where the support structure has a larger thickness. For example, in the case of the support structure shown in FIG. 4*b*, the weld region may be formed at or near the top surface 420, while the inner step 410 may be free of the weld region. In the case of the support structure shown in FIG. 4*c*, the weld region may be formed at or near the side 470.

For example, the support structure may be a support ring and may be located only within a radially outer area of the semiconductor wafer. For example, within an overlapping area of the support ring and the semiconductor wafer, there might be no semiconductor devices formed on the semiconductor wafer. For example, before separating semiconductor devices formed on the semiconductor wafer (e.g. by a sawing process), the support structure may be removed by removing an overlapping region comprising the support structure and the radially outer area of the semiconductor wafer. Removing the support structure may comprise laser cutting the support structure (e.g. together with a portion of the semiconductor wafer irreversibly bonded to the support structure), for example.

For example, the support structure may be a grid structure. For example, the grid structure may cover regions of the semiconductor wafer where no semiconductor devices are formed. For example, the grid structure may be adapted to semiconductor devices of the semiconductor wafer so that no overlap exists between the semiconductor devices and the bridges (or bars) of the grid structure. Meshes or openings of the grid structure may, for instance, overlap with the semiconductor devices. For example, for separating the semiconductor devices of the semiconductor wafer (e.g. by a sawing process) it may be possible to saw the semiconductor wafer along the grid structure, in particular the bridges (or bars) of the grid structure. Providing a grid structure as support structure may enable mechanical support and enable separating semiconductor devices by sawing, e.g. by using a common sawing process. Sawing the semiconductor wafer together with the grid may be possible as such semiconductor composite structure may have a continuous thickness along a saw line, for example.

The support structure may be a single element, or the support may be formed by two or more support structures. For example, a plurality of separate support structures may be welded onto the semiconductor wafer to support or protect the semiconductor wafer. For example, the at least one support structure may comprise at least one ring segment structure and/or at least one circular structure. For example, a plurality of ring segments may enable sufficient support for the semiconductor wafer. For example, a support may be formed by using a plurality of circular support structures, e.g. being welded within an edge region of the semiconductor wafer. The circular support structures may have a diameter (e.g., a width) of at most 20% (or at most 10%) of a diameter of the semiconductor wafer.

The separate support structures may be welded onto the semiconductor wafer with a distance between the single support structures or in direct contact with other support structures. For example, placing separate support structures in contact on the semiconductor wafer before welding the support structures may enable forming a support similar to a support by a single support structure (e.g. complete support ring). Forming a support with spaced support structures may at least reduce the risk of cracks (e.g. hair cracks) within the semiconductor wafer, as the separate support structures may stop the expansion of cracks.

For example, the at least one support structure may be welded onto a front side of the semiconductor wafer. The support structure may be welded onto a lateral portion of the semiconductor wafer, e.g. a surface of the semiconductor wafer. The support structure may be welded onto the semiconductor wafer at an edge region of the semiconductor wafer, e.g. directly on the semiconductor wafer or on semiconductor material of the semiconductor wafer. Alternatively, the support structure may be welded onto a semiconductor structure of the semiconductor wafer and/or onto a metallization structure of the semiconductor wafer (e.g. an electrical element structure of a semiconductor device formed on the semiconductor wafer, for example).

Welding the at least one support structure onto the front side may facilitate reducing the thickness of the semiconductor wafer after welding the support structure. For example, reducing the thickness of the semiconductor wafer may comprise grinding a back side of the semiconductor wafer.

For example, the at least one support structure may be welded to a front side of the semiconductor wafer. The method may further comprise placing a carrier structure at the front side of the semiconductor wafer, e.g. before reducing the thickness of the semiconductor wafer. Placing the carrier structure on the semiconductor wafer may increase a mechanical stability during reducing the thickness of the semiconductor wafer (e.g. grinding), for example. The carrier structure may be placed on a planar surface of the semiconductor wafer. The carrier structure may comprise a soft material layer on a side facing towards the semiconductor wafer. The carrier structure may be placed on the semiconductor wafer such that the support structure is located between the carrier structure and the semiconductor wafer.

For example, before placing the carrier structure at the front side, a gap between the semiconductor wafer and the carrier structure may be filled with foam material. The foam material may be non-adhesive, for example. The foam may close gaps of the support structure up to a height of the support structure, for example. For example, in the case of a grid-shaped support structure, the foam may be provided in the meshes (or openings) of the grid. In yet another example, if the support structure is ring-shaped, the foam may be provided within the inner diameter of the support structure. The foam and the support structure may close flush at a side facing away from the semiconductor wafer at least in places. Consequently, the carrier structure may contact a top surface of the support structure and the foam material. Alternatively, the foam may cover the support structure, e.g. completely, at a side facing away from the semiconductor wafer, so that the foam material is located between the carrier structure and the support structure, after placing the carrier structure, for example.

To provide a planar surface for placing the carrier structure, a surface roughness of the semiconductor wafer may be reduced, e.g. by providing glue or foam on the surface of the semiconductor wafer. For example, the carrier structure may be placed onto the support structure and voids or openings of the support structure (e.g. spaces of a grid or radial center of a support ring) may be filled, e.g. with glue or foam. Filling empty spaces between the semiconductor wafer and the carrier structure may further increase a stability of the semiconductor wafer while the carrier structure is placed on the semiconductor wafer, for example.

For example, the carrier structure may be removed, e.g. after reducing the thickness of the semiconductor wafer. Removing the carrier structure may enable separating semiconductor devices of the semiconductor wafer, for example.

For example, the at least one support structure may be welded onto a back side of the semiconductor wafer. When welding the support structure onto the back side, the semiconductor wafer may be thinned before welding the support structure. For example, the method may comprise grinding the semiconductor wafer from a back side of the semiconductor wafer and welding the support structure onto the back side of the thinned semiconductor wafer afterwards. Alternatively, e.g. when reducing the thickness of the semiconductor wafer by splitting, it may be possible to weld the support structure onto the back side of the semiconductor wafer before reducing the thickness of the semiconductor wafer.

For example, the method may further comprise processing the semiconductor wafer at a temperature of at least 400° C. (or of at least 450° C. or at least 500° C.) and/or of at most 550° C. (or of at most 500° C.). The semiconductor wafer may be processable at such temperature after welding the at least one support structure to the semiconductor wafer. For example, a combination of materials of the semiconductor wafer and the support structure (e.g. glass, e.g. a ring or a grid) and welding the support structure onto the semiconductor wafer (e.g. a front side or a back side) may enable process temperatures up to 500° C. Welding the support structure may reduce a risk of damage (e.g. cracks) of the semiconductor wafer or of structures of the semiconductor wafer when processing the semiconductor wafer at a high temperature.

For example, the support structure may be bonded to the semiconductor wafer or may be connected to the semiconductor wafer by merging the support structure and the semiconductor wafer by applying heat and/or pressure.

An aspect relates to treatment (for example to provide an absorption layer) of a surface of a semiconductor wafer (e.g. a silicon carbide SiC wafer) so that a (near-) infrared laser micro-welding technology may be applicable, e.g. to attach the support structure to the semiconductor wafer.

More details and aspects are mentioned in connection with the embodiments described above or below. The embodiments shown in FIG. 8 may comprise one or more optional additional features corresponding to one or more aspects mentioned in connection with the proposed concept or one or more embodiments described above or below (e.g. FIGS. 1 to 7j or 9 to 12g).

Figure 9:
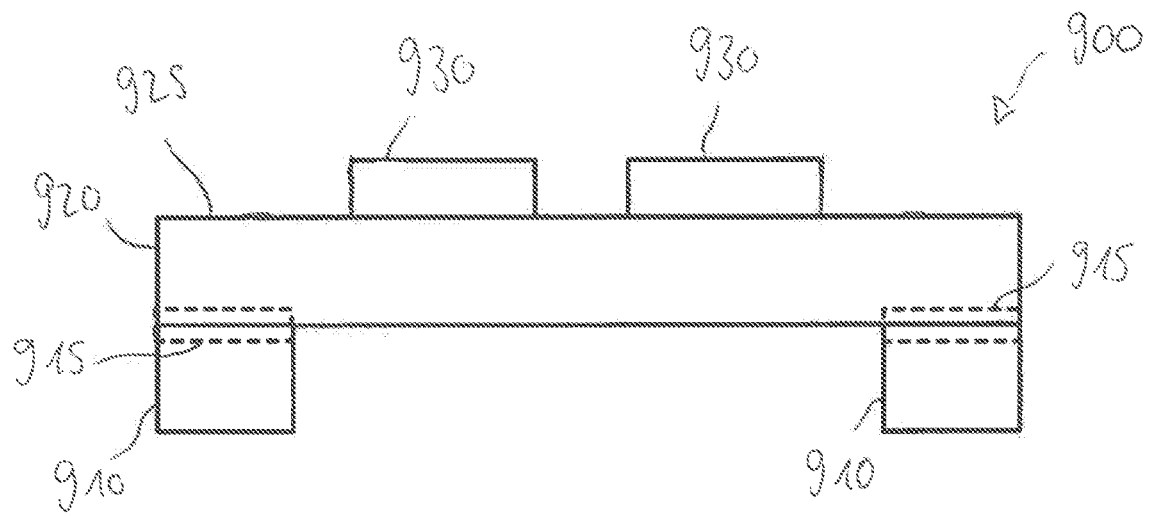
FIG. 9 shows a schematic illustration of an embodiment of a semiconductor composite structure with a support structure welded onto a semiconductor wafer.

FIG. 9 shows a schematic illustration of an embodiment of a semiconductor composite structure 900 with a support structure 910 welded onto a semiconductor wafer 920 of the semiconductor composite structure 900.

The semiconductor composite structure 900 may further comprise an electrical element structure 930 of a semiconductor device formed at a front side 925 of a semiconductor wafer 920 of the semiconductor composite structure 900. The support structure 910 may be provided by a single support structure or by a plurality of spaced support structures, for example.

The support structure 910 may be welded onto the semiconductor wafer 920. For example, the welded support structure 910 may be irreversibly connected with the semiconductor wafer. If the support structure 910 is welded to the semiconductor wafer 920, the semiconductor composite structure may subsequently be processed at temperatures up to 500° C., e.g. without gas emission due the bond of support structure 910 and semiconductor wafer 920. For example, semiconductor composite structure 900 may be processed at high temperatures due to the temperature-stable connection of the support structure 910 and the semiconductor wafer 920.

A weld region 915 may be located between a surface of the support structure 910 and the semiconductor wafer 920, for example. The weld region 915 may vertically extend into the semiconductor wafer 920 and/or into the support structure 910, for example. Within the weld region 915, material of both the support structure 910 and the semiconductor wafer 920 may be merged or fused, for example. For example, a lateral extension of the weld region 915 may be at most 50% (or at most 70% or at most 90%) of an overlapping region of the semiconductor wafer 920 and the support structure 910.

For example, the semiconductor wafer 920 may comprise a semiconductor material (e.g. a wide band gap semiconductor, e.g. silicon carbide) having a monocrystalline crystal structure. The weld region 915 at the interface of the at least one support structure 910 and the semiconductor wafer 920 may comprise the semiconductor material having a non-monocrystalline crystal structure. For example, due to the weld process, the monocrystalline crystal structure at the interface may be destroyed so that within the weld region 915 the semiconductor material gets the non-monocrystalline (e.g. poly-crystalline or amorphous) crystal structure, for example.

For example, a semiconductor material of the semiconductor wafer 920 may differ from a material of the at least one support structure. For example, the semiconductor material of the semiconductor wafer 920 in contact with the weld region 915 may differ from a material of the at least one support structure in contact with the weld region. For example, the semiconductor wafer 920 may comprise a wide band gap semiconductor material and/or the support structure 910 may comprise glass. For example, the semiconductor wafer 920 may be a silicon carbide wafer. If the support structure 910 is a silicon carbide support structure, the weld region 915 may contact a silicon layer of the silicon carbide wafer or a doped region of the silicon carbide wafer, for example.

In other embodiments, a joining region (e.g., an absorption region) may be provided between the support structure 910 and the semiconductor wafer 920, wherein the weld region 915 in this case may be positioned at an interface between the joining region and the support structure 910 and/or at an interface between the joining region and the semiconductor wafer 920. Within the weld region 915, material of the support structure 910 and the joining region and/or material of the semiconductor wafer 920 and the joining region may be merged or fused. The details above and below regarding the weld region 915 between the semiconductor wafer 920 and the support structure 910 apply, mutatis mutandis, to the weld region 915 between the semiconductor wafer 920 and the joining region and/or the support structure 910 and the joining region.

For example, a transparency of the at least one support structure for light of a first wavelength (e.g. infrared light) may be at least 50%. For example, when removing the semiconductor wafer from the at least one support structure (e.g. by grinding the semiconductor wafer) and irradiating light through the support structure, more than 50% of the light that impinges on the support structure may irradiate through the support structure. For example, when irradiating light of the first wavelength through the support structure in the direction of the weld region, at least 50% of the irradiated light reaches the weld region, for example.

For example, the semiconductor wafer may be a silicon carbide SiC wafer and/or the at least one support structure may comprise glass (e.g. the support structure may be a glass structure). For example, SiC is substantially transparent for (near-) infrared light. Therefore, a (near-) infrared absorbing layer (e.g. polysilicon) may be located (e.g. on the SiC wafer) or the absorption coefficient of the SiC wafer may be altered (e.g. by implantation) to enable absorption. The (near-) infrared absorbing layer or region with altered absorption coefficient may enable to laser micro-weld a support structure e.g. at a front side or back side of the substrate (e.g. of the SiC wafer).

Although the support structure 910 in FIG. 9 is shown welded onto a back side of the semiconductor wafer 920, it is clear that the support structure 910 can also be located on the front side, e.g. radially outside the electrical element structures 930 or semiconductor devices formed on the front side 925 of the semiconductor wafer 920 (or above electrical element structures 930), for example.

More details and aspects are mentioned in connection with the embodiments described above or below. The embodiments shown in FIG. 9 may comprise one or more optional additional features corresponding to one or more aspects mentioned in connection with the proposed concept or one or more embodiments described above or below (e.g. FIGS. 1 to 8 or 10a to 12g).

FIGS. 10a to 10e show an embodiment of a method for processing a semiconductor wafer 1000 comprising welding a support ring, e.g. a glass ring, onto the semiconductor wafer 1000. The glass ring may be placed on a back side of the semiconductor wafer 1000.

FIG. 10a shows the semiconductor wafer 1000 (e.g. a SiC wafer) comprising device structures 1010 of semiconductor devices formed at a front side of the semiconductor wafer 1000. A carrier structure 1020 (e.g. reversible carrier) is placed at the front side of the semiconductor wafer 1000. FIG. 10a shows the semiconductor wafer 1000 after complete processing of semiconductor devices of the semiconductor wafer 1000, for example. The semiconductor wafer 1000 may have a reduced thickness, e.g. the semiconductor wafer 1000 may be thinned by splitting and/or grinding. The semiconductor wafer 1000 may have a final thickness (e.g. less than 70 nm), e.g. used for separating the semiconductor devices of the semiconductor wafer 1000, e.g. in a sawing process.

After placing the carrier structure 1020, the semiconductor wafer 1000 may be turned and a silicide layer 1030, e.g. a nickel silicide (NiSi) layer, may be formed on the back side of the semiconductor wafer 1000. A nickel layer on the backside may be annealed, e.g. by laser thermal anneal (LTA), so that the resulting NiSi layer is formed on the back side of the semiconductor wafer 1000 (e.g. on semiconductor material, e.g. silicon carbide, of the semiconductor wafer 1000). The resulting NiSi layer may have a thickness between 70 nm and 150 nm, for example. The silicide layer 1030 may provide a thin ohmic contact metallization layer at the back side of the semiconductor wafer 1000, for example. In addition, part of the silicide layer 1030 may be used as an absorption layer for laser welding, for example.

In FIG. 10c, the semiconductor wafer 1000 is shown with a support structure 1040, e.g. the glass ring, placed on the back side of the semiconductor wafer 1000. The support ring radially overlaps the semiconductor wafer 1000. Light (e.g. laser light) may be irradiated through the support structure 1040 and may be absorbed by the silicide layer 1030. The absorbed light may heat the surface between the support structure 1040 and the semiconductor wafer 1000, and a weld region may form so that the support structure 1040 is permanently connected with the semiconductor wafer 1000.

After welding the support structure 1040 onto the semiconductor wafer 1000, a back-side metallization layer 1050 for soldering and/or sintering may be formed on the silicide layer 1030 (see FIG. 10d). For example, the back-side metallization layer 1050 may also cover one or more side walls of the support structure 1040 and/or a surface of the support structure opposite to the semiconductor wafer 1000.

After forming the back-side metallization layer 1050, the carrier structure 1020 may be removed, for example, as shown in FIG. 10e. Afterwards, the semiconductor devices with the device structures 1010 formed on the semiconductor wafer 1000 may be separated. For example, it may be possible to saw the semiconductor wafer 1000 together with the support structure 1040, e.g. if the support structure 1040 is a grid structure (e.g. the grid structure may be formed above Kerf regions laterally between the semiconductor devices).

For example, before sawing the semiconductor wafer 1000, the support structure 1040 may be removed, for example together with a portion of the semiconductor wafer 1000 overlapping with the support structure. Removing the glass ring shown in FIGS. 10a to 10e may comprise cutting-out the radially outer portion of the semiconductor wafer 1000 where the support structure 1040 (e.g. the glass ring) and the semiconductor wafer 1000 laterally overlap.

More details and aspects are mentioned in connection with the embodiments described above or below. The embodiments shown in FIG. 10a to 10e may comprise one or more optional additional features corresponding to one or more aspects mentioned in connection with the proposed concept or one or more embodiments described above or below (e.g. FIGS. 1 to 9 or 11a to 12g).

FIGS. 11a to 11f show a further embodiment of a method for processing a semiconductor wafer 1000 comprising welding a support ring 1040 onto the semiconductor wafer 1000 by using an absorption layer of silicon, e.g. amorphous silicon 1100.

FIG. 11a shows the semiconductor wafer 1000 with device structures 1010 and the carrier structure 1020, as shown in FIG. 10a.

The layer of amorphous silicon 1100 may be formed on the back side of the semiconductor wafer 1000 (see FIG. 11b). For example, amorphous silicon 1100 may be deposited only in a radially outer region of the semiconductor wafer 1000, e.g. radially outside the device structures 1010. The absorption layer of amorphous silicon 1100 may be formed so that the amorphous silicon 1100 is located only within an area where it will overlap with the support ring 1040, for example.

FIG. 11c shows the placement of the support structure 1040 on the amorphous silicon 1100 at the back side of the semiconductor wafer 1000. As an alternative to amorphous silicon, a polysilicon layer may be deposited as absorption layer. The amorphous silicon 1100 may be nontransparent for light of the first wavelength, for example infrared light. The support structure 1040 may be at least substantially transparent for light of the first wavelength. For example, laser light may be irradiated through the support structure 1040 onto the amorphous silicon 1100 to weld the support structure 1040 onto the semiconductor wafer 1000, e.g. onto the amorphous silicon layer at the surface of the semiconductor wafer 1000.

FIGS. 11d-f show further process steps similar to FIGS. 10b-e. FIG. 11d shows forming a silicide layer 1030 on the back side of the semiconductor wafer 1000. The silicide layer 1030 may be formed on the semiconductor wafer 1000 and on the support structure 1040, for example. After forming the silicide layer 1030, a back-side metallization layer 1050 may be formed on the silicide layer 1030. After turning the semiconductor composite structure comprising the semiconductor wafer 1000 and the support structure 1040, the carrier structure 1020 may be removed.

As an alternative for providing the absorption layer, instead of (or additionally to) forming the amorphous silicon 1100, ions may be implanted to form the absorption layer. For example, the back side of the semiconductor wafer 1000 (as shown in FIG. 11a) may be masked, and ions may be implanted into the semiconductor wafer 1000 with a high implantation dose. For example, the mask may expose only a weld region (e.g. the lateral area of the amorphous silicon 1100 as shown in FIG. 11b). An implantation layer may be formed to increase local absorption and may enable the absorption of energy necessary for the weld process, for example.

More details and aspects are mentioned in connection with the embodiments described above or below. The embodiments shown in FIG. 11a to 11f may comprise one or more optional additional features corresponding to one or more aspects mentioned in connection with the proposed concept or one or more embodiments described above or below (e.g. FIGS. 1 to 10e or 12a to 12g).

FIGS. 12a to 12g show an embodiment of a method for processing a semiconductor wafer 1000 comprising welding a support ring 1040 onto a front side of the semiconductor wafer 1000.

FIG. 12a shows the semiconductor wafer 1000 with a silicon portion 1200 (e.g. polysilicon) in an edge region of the semiconductor wafer 1000. For example, the semiconductor wafer 1000 shown in FIG. 12a might not be thinned to its final thickness yet.

For example, semiconductor devices formed on the semiconductor wafer 1000 may comprise trenches. For example, transistors with trenches (e.g. SiC trench MOSFETs) may be formed on the semiconductor wafer 1000. When etching trenches for the semiconductor devices, trenches in the edge region (or weld region) may be formed simultaneously. In a further process step, the trenches in the edge region may be filled with (poly-) silicon. For example, during subsequent etching processes, the polysilicon of the silicon portion 1200 may be protected by a mask or protection layer. Before placing the support structure 1040 on the semiconductor wafer 1000, the semiconductor wafer 1000 may be etched back (e.g. only in the edge region) to expose the silicon portion 1200 such that the support structure 1040 can contact the silicon portion 1200, for example. For example, SiC diodes may be formed on the semiconductor wafer 1000 and the silicon portion 1200 (e.g. comprising polysilicon) may be formed together with the SiC diodes by common semiconductor processes.

The silicon portion 1200 may be formed within a trench of the semiconductor wafer 1000 and the silicon portion 1200 may form a planar surface with the semiconductor wafer, for example. Alternatively, the silicon portion 1200 may be grown higher than a surface in a center of the semiconductor wafer 1000, for example to enable better contact with the support structure 1040.

FIG. 12b shows the semiconductor wafer 1000 with a support structure 1040, e.g. a glass ring, welded to the front side of the semiconductor wafer 1000 by use of the silicon portion 1200 as absorption layer.

Contrary to the examples of FIGS. 10a-e and 11a-f, the carrier structure 1020 may be positioned on the front side of the semiconductor wafer 1000 (see FIG. 12c). For example, for enabling a good contact to the carrier structure 1020, a planar surface may be formed at the front side of the semiconductor wafer 1000 by providing a filling layer 1210 before placing the carrier structure 1020 onto the semiconductor wafer 1000. For example, the support structure 1040 may extend vertically over the device structures 1010 and/or the front surface of the semiconductor wafer 1000. The filling layer 1210 may close the gaps located laterally between the support structure 1040 (e.g. an inner circle of the support ring) at least vertically up to an upper surface of the support structure 1040.

The filling layer 1210 may further increase a mechanical stabilization or support of the semiconductor wafer 1000, for example. The filling layer 1210 may comprise non-adhesive foam, for example. Alternatively or additionally, the filling layer 1210 may be an adhesive layer, e.g. comprising glue.

The carrier structure 1020 may be placed on the filling layer 1210, for example. The carrier structure 1020 may contact the filling layer 1210 and the support structure 1040, for example top surfaces of the filling layer 1210 and the support structure 1040. Alternatively, the filling layer 1210 may cover the support structure 1040 and consequently the carrier structure 1020 may contact only the filling layer 1210, for example to achieve better contact to the carrier structure 1020.

The carrier structure 1020 may mechanically support the semiconductor wafer 1000 while reducing its thickness (see FIG. 11d). For example, the semiconductor wafer 1000 may be grinded and/or split to achieve the final thickness.

After reducing the thickness of the semiconductor wafer 1000, a silicide layer 1030 may be formed on the back side of the semiconductor wafer 1000, as shown in FIG. 12e. A back-side metallization layer 1050 is formed on the silicide layer 1030, for example (see FIG. 12*f*). Subsequently, the carrier structure 1020 may be removed from the front side of the semiconductor wafer 1000 (e.g. together with the filling layer 1210) as shown in FIG. 12g. For example, the carrier structure 1020 may be removed before forming the back-side metallization layer 1050.

For example, as an alternative absorption layer, instead of (or additional to) forming the silicon portion 1200, an implantation layer may be formed at the front side. The support structure 1040 may be welded to the front side by using the implantation layer as absorption layer, for example. The implantation of ions may be performed after completing an Imid process, for example. For example, a polyimide layer is formed on the semiconductor wafer. The polyimide layer may be recessed in kerf regions of the semiconductor wafer to uncover the semiconductor material of the semiconductor wafer. Then ions may be implanted in the uncovered regions to form the absorption layer. The implantation layer may increase the absorption coefficient of the surface layer of the semiconductor wafer 1000, for example, to enable welding the support structure 1040 onto the semiconductor wafer 1000.

For example, as an alternative absorption layer, instead of (or additional to) forming the silicon portion 1200 and/or the implantation layer, a metallization structure at the front side (e.g. within the edge region of the semiconductor wafer 1000) may be formed or used. During a manufacturing process of semiconductor devices on the semiconductor wafer 1000, metallization structures of semiconductor devices may be formed (e.g. wiring layer or contact layer of the device structures 1010). It may be easy and efficient to form such metallization structures (e.g. titanium (Ti) metallization, nickel aluminum (NiAl) metallization, copper (Cu) and/or aluminum copper (AlCu) metallization) also within the edge region (or e.g. in regions not used for forming semiconductor devices) that is provided for welding the support structure 1040, for example. During etching processes (e.g. for structuring a metal layer), the metallization structures within the edge region may be masked, for example, to protect the metallization structures to be used as absorption regions. Before welding the support structure 1040, the front side of the semiconductor wafer 1000 may be etched to expose the metallization structures (e.g. to enable direct contact of the support structure 1040 with the metallization structure) in the edge region.

The edge region of a semiconductor wafer is e.g. the outermost part of the semiconductor wafer and/or extends from an edge of the semiconductor wafer towards the center of the semiconductor wafer by less than 10% (or less than 5%, or less than 3%) of a diameter of the semiconductor wafer, for example.

Similar to the described methods, that use a ring structure as support structure 1040, a grid (e.g. a glass grid) may be used as support structure 1040. For example, forming an absorption region, e.g. an absorption layer, for a grid at a back side of the semiconductor wafer 1000 may be easier than forming an absorption region for a grid at a front side of the semiconductor wafer 1000 (e.g. due to the device structures 1010 formed at the front side).

More details and aspects are mentioned in connection with the embodiments described above or below. The embodiments shown in FIGS. 12a to 12g may comprise one or more optional additional features corresponding to one or more aspects mentioned in connection with the proposed concept or one or more embodiments described above or below (e.g. FIGS. 1 to 110).

Based on the concepts described herein it may be possible to manufacture future thin-wafer technologies (e.g. on EPI-basis via buried separation layers) with a low total thickness variation (TTV). Other concepts may use a support ring located on the back side generated by grinding. A disadvantage of the other concepts may be that the complete substrate material (start wafer) may only be used once.

With the proposed concepts (e.g. on EPI-basis) it may be possible to manufacture thin-wafer technologies using the start substrate several times and reaching a similar yield. The concept described herein may enable: using transport and handling (including transport carrier); using the start substrate again/several times; comparable thin-wafer yield; wafer test after thinning; and/or recycling the support. A reusable support ring may be applied to the wafer back side (alternatively: application by 3D printing). Possible times for applying may be: directly after setting the final wafer thickness; after removing the auxiliary layer/splitting layer; after back side processes (without back side metal); and/or after back side processes (including back side metal).

The method may serve as an enabler for power semiconductors based on a thick epitaxial layer (cost reduction in the complete process by possibility of recycling the start substrate) and/or as an enabler for substrate reuse concept with high thin-wafer yield. In other processes wherein the support ring is generated by means of grinding, etching or ablation, the substrate a re-use concept might not be possible.

Some examples relate to methods for manufacturing thin wafers using buried separation layers. Some examples relate to thin wafer carrier systems for new technologies. The described methods may be applicable to silicon semiconductors as well as for other semiconductor materials.

Other semiconductor wafers may be grinded partially on one side of the semiconductor wafer to provide a thinned portion of the semiconductor wafer while maintaining a thicker edge region of the wafer surrounding the grinded thinned portion. The thicker edge region may provide mechanical stability to the wafer.

Grinding the wafer only partially may result in a varying thickness of the semiconductor wafer within the thinned portion of the wafer. The grinded material of the semiconductor wafer may be no longer usable such that grinding may increase a cost of the semiconductor wafer due to high consumption of semiconductor material.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A method for processing a semiconductor wafer, the method comprising:
   welding at least one support structure onto the semiconductor wafer; and
   reducing a thickness of the semiconductor wafer before or after welding the at least one support structure onto the semiconductor wafer.

2. The method of claim 1, wherein welding the at least one support structure onto the semiconductor wafer comprises:
   placing the at least one support structure on the semiconductor wafer; and
   irradiating light through the at least one support structure or through the semiconductor wafer to form a weld region,
   wherein the weld region is an interface between the at least one support structure and the semiconductor wafer, and/or a joining structure between the at least one support structure and the semiconductor wafer.

3. The method of claim 2, wherein light of a first wavelength is irradiated through the at least one support structure, and wherein at least 50% of the light of the first wavelength impinging on the support structure is transmitted through the support structure and reaches the weld region.

4. The method of claim 1, further comprising:
   before welding the at least one support structure, forming an absorption region on the semiconductor wafer or on the at least one support structure.

5. The method of claim 4, wherein the absorption region comprises a silicide layer.

6. The method of claim 5, wherein the silicide layer is a nickel silicide layer, a cobalt silicide layer or a titanium silicide layer.

7. The method of claim 4, wherein the absorption region comprises a polysilicon layer or an amorphous silicon layer.

8. The method of claim 4, wherein forming the absorption region comprises implanting ions so that the absorption region comprises a doping concentration of at least $1\cdot10^{19}$ cm$^3$.

9. The method of claim 4, further comprising:
before reducing the thickness of the semiconductor wafer, forming an electrical element structure of a semiconductor device at a front side of the semiconductor wafer,
wherein forming the electrical element structure comprises of forming a polycrystalline silicon layer and/or forming a metallization layer,
wherein the absorption region comprises a part of the polycrystalline silicon layer and/or the metallization layer.

10. The method of claim 1, wherein the at least one support structure comprises a ring structure or a grid structure.

11. The method of claim 1, wherein the at least one support structure comprises at least one ring segment structure and/or at least one circular structure.

12. The method of claim 1, wherein the at least one support structure is welded to a front side of the semiconductor wafer, and wherein the method further comprises:
before reducing the thickness of the semiconductor wafer, placing a carrier structure at the front side of the semiconductor wafer.

13. The method of claim 12, further comprising:
before placing the carrier structure at the front side, filling a gap between the semiconductor wafer and the carrier structure with foam material.

14. The method of 12, further comprising:
after reducing the thickness of the semiconductor wafer, removing the carrier structure.

15. The method of claim 1, further comprising:
after welding the at least one support structure onto the semiconductor wafer, processing the semiconductor wafer at a temperature of at least 400° C.

* * * * *